(12) United States Patent
Madan et al.

(10) Patent No.: US 9,735,752 B2
(45) Date of Patent: Aug. 15, 2017

(54) APPARATUS AND METHODS FOR TUNABLE FILTERS

(71) Applicant: TDK Corporation, Tokyo, OT (JP)

(72) Inventors: Anuj Madan, Somerville, MA (US); George E. Nohra, Marlborough, MA (US); Mohsin Asif, Somerville, MA (US); Chris Levesque, Fountain Valley, CA (US)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/559,785

(22) Filed: Dec. 3, 2014

(65) Prior Publication Data
US 2016/0164481 A1 Jun. 9, 2016

(51) Int. Cl.
*H03H 7/09* (2006.01)
*H03H 7/01* (2006.01)
*H03H 7/38* (2006.01)

(52) U.S. Cl.
CPC ........ *H03H 7/0115* (2013.01); *H03H 7/0161* (2013.01); *H03H 7/09* (2013.01);
(Continued)

(58) Field of Classification Search
CPC .. H03H 7/0153; H03H 7/0161; H03H 7/0115; H03H 7/09; H03H 7/1758;
(Continued)

(56) References Cited

U.S. PATENT DOCUMENTS 4,363,009 A 12/1982 Malcolm et al.
4,423,396 A * 12/1983 Makimoto et al. ........... 333/204
(Continued)

FOREIGN PATENT DOCUMENTS

EP 0 581 702 A1 2/1994
EP 0 716 468 B1 10/2001
(Continued)

OTHER PUBLICATIONS

Leifso et al., "A Fully Integrated Active Inductor with Independent Voltage Tunable Inductance and Series-Loss Resistance," IEEE Transaction on Microwave Theory and Techniques, vol. 49, No. 4, Apr. 2001, 7 Pages.
(Continued)

*Primary Examiner* — Stephen E Jones
*Assistant Examiner* — Rakesh Patel
(74) *Attorney, Agent, or Firm* — Nixon Peabody LLP

(57) ABSTRACT

Apparatus and methods for tunable filters are provided. In certain configurations, a tunable filter includes a semiconductor die attached to a laminated substrate, such as a substrate of a multi-chip module (MCM). The tunable filter includes a vector inductor implemented using two or more conductors arranged on different conductive layers of the laminated substrate. The vector inductor's conductors are inductively coupled to one another and electrically connected in parallel to provide the vector inductor with high quality factor (Q-factor). The semiconductor die includes a variable capacitor that is electrically connected with the vector inductor to operate as a tunable resonator. Additionally, a frequency characteristic of the tunable filter, such as a passband, can be controlled by selecting a capacitance value of the variable capacitor, thereby tuning a resonance of the resonator.

22 Claims, 17 Drawing Sheets

(52) U.S. Cl.
CPC .......... *H03H 7/175* (2013.01); *H03H 7/1758* (2013.01); *H03H 7/1766* (2013.01); *H03H 7/1775* (2013.01); *H03H 7/38* (2013.01)

(58) Field of Classification Search
CPC .... H03H 7/175; H03H 7/1775; H03H 7/1766; H01F 2027/2809
USPC .......................... 333/174, 175, 185; 336/200
See application file for complete search history.

(56) References Cited

U.S. PATENT DOCUMENTS

| | | | |
|---|---|---|---|
| 4,456,895 A * | 6/1984 | Landt et al. | ................... 333/174 |
| 4,754,242 A | 6/1988 | Okamura et al. | |
| 4,878,151 A | 10/1989 | Gallichio | |
| 5,208,597 A | 5/1993 | Early et al. | |
| 5,227,746 A | 7/1993 | Esaki et al. | |
| 5,321,597 A | 6/1994 | Alacoque | |
| 5,452,178 A | 9/1995 | Emesh et al. | |
| 5,530,415 A * | 6/1996 | Takaya et al. | ................... 336/83 |
| 5,543,751 A | 8/1996 | Stedman et al. | |
| 5,621,366 A * | 4/1997 | Gu | .......................... H01P 7/084 |
| | | | 333/185 |
| 6,124,624 A * | 9/2000 | Van Roosmalen | . H01F 17/0006 |
| | | | 257/531 |
| 6,198,374 B1 | 3/2001 | Abel | |
| 6,211,745 B1 | 4/2001 | Mucke et al. | |
| 6,222,221 B1 | 4/2001 | Hou et al. | |
| 6,293,001 B1 | 9/2001 | Uriu et al. | |
| 6,351,020 B1 | 2/2002 | Tarabbia et al. | |
| 6,377,075 B1 | 4/2002 | Wong | |
| 6,410,954 B1 | 6/2002 | Sowlati et al. | |
| 6,437,677 B1 | 8/2002 | Takeuchi et al. | |
| 6,438,000 B1 | 8/2002 | Okamoto et al. | |
| 6,472,960 B1 | 10/2002 | Ishikawa et al. | |
| 6,608,538 B2 | 8/2003 | Wang | |
| 6,657,509 B1 | 12/2003 | Ohannes | |
| 6,664,882 B2 | 12/2003 | Andoh et al. | |
| 6,674,321 B1 | 1/2004 | York | |
| 6,765,778 B1 | 7/2004 | Du et al. | |
| 6,882,548 B1 | 4/2005 | Jacobs et al. | |
| 6,885,081 B2 | 4/2005 | Morimoto | |
| 6,940,386 B2 | 9/2005 | Mukherjee et al. | |
| 7,000,000 B1 | 2/2006 | O'Brien | |
| 7,023,316 B2 | 4/2006 | Ahn et al. | |
| 7,212,789 B2 | 5/2007 | Kuffner | |
| 7,245,519 B2 | 7/2007 | McQuirk et al. | |
| 7,251,121 B2 | 7/2007 | Bhutta | |
| 7,253,704 B2 | 8/2007 | Park et al. | |
| 7,255,801 B2 | 8/2007 | Chen | |
| 7,280,001 B2 | 10/2007 | Maligeorgos et al. | |
| 7,408,422 B2 | 8/2008 | Dedieu et al. | |
| 7,439,828 B2 | 10/2008 | Wada | |
| 7,446,628 B2 | 11/2008 | Morris, III | |
| 7,453,136 B2 | 11/2008 | Hakkarainen | |
| 7,528,667 B1 | 5/2009 | Tan et al. | |
| 7,576,627 B2 | 8/2009 | Shastry et al. | |
| 7,586,389 B2 | 9/2009 | Ali-Ahmed et al. | |
| 7,656,251 B1 | 2/2010 | Bauder et al. | |
| 7,692,527 B2 * | 4/2010 | Ito et al. | ...................... 336/200 |
| 7,719,083 B2 | 5/2010 | Chang | |
| 7,728,427 B2 | 6/2010 | Gabara | |
| 7,920,030 B2 | 4/2011 | Jang et al. | |
| 8,134,222 B2 | 3/2012 | Khan et al. | |
| 8,203,419 B2 | 6/2012 | Nazarian et al. | |
| 8,204,031 B2 | 6/2012 | Jian et al. | |
| 8,289,103 B2 | 10/2012 | Yamakawa et al. | |
| 8,289,118 B2 | 10/2012 | Chiu et al. | |
| 8,324,069 B1 | 12/2012 | Carns et al. | |
| 8,324,692 B2 | 12/2012 | Chen et al. | |
| 8,324,984 B2 | 12/2012 | Gavin et al. | |
| 8,395,880 B2 | 3/2013 | Wasson | |
| 8,531,862 B2 | 9/2013 | Roest et al. | |
| 8,760,241 B1 | 6/2014 | Ashworth et al. | |
| 9,019,007 B2 | 4/2015 | Gupta et al. | |
| 9,086,709 B2 | 7/2015 | Gupta et al. | |
| 9,110,483 B2 | 8/2015 | Madan et al. | |
| 9,201,442 B2 | 12/2015 | Gupta et al. | |
| 9,449,749 B2 | 9/2016 | Gupta et al. | |
| 2002/0140115 A1 | 10/2002 | Inoh et al. | |
| 2002/0158305 A1 | 10/2002 | Dalmia et al. | |
| 2003/0122619 A1 | 7/2003 | Ishida et al. | |
| 2004/0066244 A1 | 4/2004 | Takinami et al. | |
| 2004/0070468 A1 | 4/2004 | Harada | |
| 2004/0127167 A1 | 7/2004 | Zipper et al. | |
| 2004/0140528 A1 | 7/2004 | Kim et al. | |
| 2004/0164836 A1 | 8/2004 | Wang et al. | |
| 2005/0012567 A1 | 1/2005 | Liu | |
| 2005/0030116 A1 * | 2/2005 | Takagi | ...................... 331/177 V |
| 2005/0064159 A1 | 3/2005 | Amou et al. | |
| 2005/0116797 A1 | 6/2005 | Shamsaifar et al. | |
| 2005/0162234 A1 | 7/2005 | Kobayashi et al. | |
| 2005/0184812 A1 | 8/2005 | Cho | |
| 2005/0237131 A1 | 10/2005 | Chang et al. | |
| 2006/0006431 A1 | 1/2006 | Jean et al. | |
| 2006/0043499 A1 | 3/2006 | De Cremoux et al. | |
| 2006/0077020 A1 * | 4/2006 | Wang et al. | ................... 333/204 |
| 2006/0103456 A1 | 5/2006 | Azimi et al. | |
| 2006/0125121 A1 | 6/2006 | Ko et al. | |
| 2007/0075791 A1 | 4/2007 | Dedieu et al. | |
| 2008/0042771 A1 | 2/2008 | Han et al. | |
| 2008/0048236 A1 | 2/2008 | Kim | |
| 2008/0197923 A1 | 8/2008 | Nakajima et al. | |
| 2008/0265977 A1 | 10/2008 | Gu | |
| 2008/0267270 A1 | 10/2008 | Darabi | |
| 2009/0033439 A1 | 2/2009 | Igarashi | |
| 2009/0096507 A1 | 4/2009 | Gao et al. | |
| 2009/0128992 A1 | 5/2009 | Haralabios | |
| 2009/0160263 A1 | 6/2009 | Spears et al. | |
| 2009/0179713 A1 * | 7/2009 | Zeng | ...................... H03H 7/09 |
| | | | 333/176 |
| 2009/0179722 A1 | 7/2009 | Goyette et al. | |
| 2009/0243743 A1 | 10/2009 | Kossel et al. | |
| 2009/0273416 A1 | 11/2009 | Nakatsuka et al. | |
| 2009/0325521 A1 | 12/2009 | Dubash et al. | |
| 2010/0039189 A1 | 2/2010 | Taniguchi | |
| 2010/0052778 A1 | 3/2010 | Baranauskas | |
| 2010/0079167 A1 | 4/2010 | Thomsen | |
| 2010/0134182 A1 | 6/2010 | Kapoor et al. | |
| 2010/0285769 A1 | 11/2010 | Conroy et al. | |
| 2011/0002080 A1 | 1/2011 | Ranta | |
| 2011/0109380 A1 | 5/2011 | Park et al. | |
| 2011/0121910 A1 | 5/2011 | Yang et al. | |
| 2011/0187487 A1 * | 8/2011 | Hsu | ...................... H01L 23/5227 |
| | | | 336/200 |
| 2011/0298526 A1 | 12/2011 | Homol et al. | |
| 2011/0309994 A1 | 12/2011 | Kato et al. | |
| 2011/0316062 A1 | 12/2011 | Kondo et al. | |
| 2012/0146742 A1 | 6/2012 | Caron et al. | |
| 2012/0193771 A1 | 8/2012 | Masuda | |
| 2012/0208473 A1 | 8/2012 | Aparin | |
| 2012/0211868 A1 | 8/2012 | Stribley et al. | |
| 2012/0213015 A1 | 8/2012 | Romanovskyy et al. | |
| 2013/0039228 A1 | 2/2013 | Caron | |
| 2013/0083703 A1 | 4/2013 | Granger-Jones et al. | |
| 2013/0090067 A1 | 4/2013 | Rofougaran et al. | |
| 2013/0090080 A1 | 4/2013 | Schmidt | |
| 2013/0093703 A1 | 4/2013 | Yang et al. | |
| 2013/0099864 A1 | 4/2013 | Kawai et al. | |
| 2013/0169378 A1 | 7/2013 | Kim et al. | |
| 2013/0200980 A1 | 8/2013 | Yokoyama et al. | |
| 2013/0257558 A1 * | 10/2013 | Kim et al. | ...................... 333/32 |
| 2014/0009211 A1 | 1/2014 | Madan et al. | |
| 2014/0062575 A1 | 3/2014 | Hurwitz | |
| 2014/0266408 A1 | 9/2014 | Guimaraes et al. | |
| 2014/0266502 A1 | 9/2014 | Gupta et al. | |
| 2014/0285286 A1 | 9/2014 | Bojer | |
| 2014/0285299 A1 * | 9/2014 | Bojer | ...................... 336/105 |
| 2014/0354348 A1 | 12/2014 | Gupta et al. | |
| 2014/0354370 A1 | 12/2014 | Gupta et al. | |
| 2014/0354377 A1 | 12/2014 | Gupta et al. | |
| 2014/0355171 A1 | 12/2014 | Gupta et al. | |
| 2014/0355172 A1 | 12/2014 | Gupta et al. | |
| 2014/0367831 A1 | 12/2014 | Yen et al. | |

(56) References Cited

U.S. PATENT DOCUMENTS

| | | | | |
|---|---|---|---|---|
| 2015/0236014 | A1* | 8/2015 | Gathman | H01L 27/0808 327/537 |
| 2016/0161970 | A1 | 6/2016 | Gupta et al. | |
| 2016/0163464 | A1 | 6/2016 | Madan et al. | |
| 2016/0163697 | A1 | 6/2016 | Madan et al. | |
| 2016/0164482 | A1 | 6/2016 | Madan et al. | |
| 2016/0164484 | A1 | 6/2016 | Madan et al. | |
| 2016/0164492 | A1 | 6/2016 | Madan et al. | |

FOREIGN PATENT DOCUMENTS

| | | |
|---|---|---|
| EP | 0 780 853 B1 | 9/2002 |
| EP | 1 260 998 A1 | 11/2002 |
| EP | 2 392 382 A1 | 12/2011 |
| JP | S63 308366 | 12/1988 |
| JP | 2006128468 | 5/2006 |
| WO | 2006/099419 A1 | 9/2006 |
| WO | WO 2013-028546 A1 | 2/2013 |
| WO | 2014/193501 A1 | 12/2014 |
| WO | 2014/193502 A1 | 12/2014 |
| WO | 2014/193503 A1 | 12/2014 |
| WO | 2014/193845 A2 | 12/2014 |
| WO | 2014/193846 A1 | 12/2014 |
| WO | 2016/089532 A1 | 6/2016 |

OTHER PUBLICATIONS

Sauerbrey J., et al., "A 0.7-V MOSFET-Only Switched-OPAMP SigmaDelta Modulator in Standard Digital CMOS Technology", IEEE Journal of Solid-State Circuits, vol. 37, No. 12, Dec. 2002, pp. 1662-1669.
Ming-Jer Chen et al: "A Novel Cross-Coupled Inter-Poly-Oxide Capacitor for Mixed-Mode CMOS Processes", IEEE Electron Device Letters, vol. 20, No. 7, Jul. 1999 (3 pages).
Han Q et al: "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.
Pietro Andreani et al: "On the Use of MOS Varactors in RF VCO's", IEEE Journal of Solid-State Circuits, vol. 35, No. 6, Jun. 2000 (6 pages).
Kampe, A et al., "An LC-VCO with one octave tuning range," IEEE European Conference on Circuit Theory and Design, vol. 3, Aug. 29, 2005, pp. 321-324.
Nakamura, T et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.
Zhiqiang et al., "A Multi-Band RF CMOS LC Bandpass Filter with Continuous Frequency Tuning Design." 2010 International Conference on Computer Application and System Modeling (ICCASM 2010). 4 pages.
Invitation to Pay Additional Fees for International Application No. PCT/US2014/039599, mailed Aug. 12, 2014.
International Search Report and Written Opinion for International Application No. PCT/US2014/039599, mailed Nov. 13, 2014.
International Search Report and Written Opinion for International Application No. PCT/US2014/018673, mailed Jun. 5, 2014.
International Search Report and Written Opinion for International Application No. PCT/US2014/018611, mailed Aug. 26, 2014.
Invitation to Pay Additional Fees for International Application No. PCT/US2014/018611, mailed Jun. 10, 2014.
International Search Report and Written Opinion for International Application No. PCT/US2014/039595, mailed Jan. 20, 2015.
Invitation to Pay Additional Fees for International Application No. PCT/US2014/039595, mailed Nov. 6, 2014.
Office Action in U.S. Appl. No. 13/955,617, mailed May 18, 2015.
Office Action in U.S. Appl. No. 13/955,617, mailed Oct. 29, 2015.
Notice of Allowance in U.S. Appl. No. 14/288,127, mailed Dec. 22, 2015.
Corrected Notice of Allowance in U.S. Appl. No. 14/288,127, mailed Jan. 21, 2016.
Office Action in U.S. Appl. No. 14/014,496, mailed May 12, 2014.
Office Action in U.S. Appl. No. 14/014,496, mailed Dec. 31, 2014.
Notice of Allowance in U.S. Appl. No. 14/014,496, mailed Mar. 25, 2015.
Notice of Allowance in U.S. Appl. No. 14/288,115, mailed May 29, 2015.
Corrected Notice of Allowance in U.S. Appl. No. 14/288,115, mailed Jun. 10, 2015.
Office Action in U.S. Appl. No. 14/601,137, mailed Apr. 30, 2015.
Notice of Allowance in U.S. Appl. No. 14/601,137, mailed Jun. 24, 2015.
Corrected Notice of Allowance in U.S. Appl. No. 14/601,137, mailed Jul. 10, 2015.
Office Action in U.S. Appl. No. 14/674,701, mailed May 13, 2015.
Office Action in U.S. Appl. No. 14/674,701, mailed Jun. 9, 2015.
Notice of Allowance in U.S. Appl. No. 14/674,701, mailed Oct. 2, 2015.
Corrected Notice of Allowance in U.S. Appl. No. 14/674,701, mailed Oct. 22, 2015.
Office Action in U.S. Appl. No. 13/955,617, mailed May 16, 2016.
Office Action in U.S. Appl. No. 14/952,451, mailed Apr. 7, 2016.
International Search Report and Written Opinion for International Application No. PCT/US2015/059018, mailed Feb. 19, 2016.
Ou, Hok Huor et al., "Design of Super High Power SAW Filter", Proceedings IEEE Ultrasonics Symposium 1991, vol. 1, pp. 161-166, 1991.
Office Action in U.S. Appl. No. 14/025,069, mailed Jun. 4, 2015.
Office Action in U.S. Appl. No. 14/025,069, mailed Oct. 19, 2015.
Notice of Allowance in U.S. Appl. No. 14/025,069, mailed May 6, 2016.
Office Action in U.S. Appl. No. 14/705,386, mailed Oct. 8, 2015.
Notice of Allowance in U.S. Appl. No. 14/705,386, mailed Jun. 8, 2016.
Office Action in U.S. Appl. No. 14/705,381, mailed Jul. 31, 2015.
Office Action in U.S. Appl. No. 14/705,381, mailed Oct. 27, 2015.
Office Action in U.S. Appl. No. 14/705,381, mailed Mar. 22, 2016.
Office Action in U.S. Appl. No. 14/705,429, mailed Oct. 29, 2015.
Office Action in U.S. Appl. No. 14/705,429, mailed Mar. 31, 2016.
Notice of Allowance in U.S. Appl. No. 14/705,429, mailed Jul. 29, 2016.
Office Action in U.S. Appl. No. 14/705,476, mailed Aug. 31, 2015.
Office Action in U.S. Appl. No. 14/705,476, mailed Nov. 9, 2015.
Office Action in U.S. Appl. No. 14/705,476, mailed Mar. 8, 2016.
Office Action in U.S. Appl. No. 14/559,783, mailed Mar. 19, 2015.
Office Action in U.S. Appl. No. 14/559,783, mailed Jun. 18, 2015.
Office Action in U.S. Appl. No. 14/559,783, mailed Feb. 12, 2016.
Notice of Allowance in U.S. Appl. No. 14/559,783, mailed Oct. 15, 2015.
Corrected Notice of Allowance in U.S. Appl. No. 14/559,783, mailed Nov. 3, 2015.
Notice of Allowance in U.S. Appl. No. 14/559,783, mailed Jun. 9, 2016.
International Search Report and Written Opinion for International Application No. PCT/US2014/018555, mailed Jun. 20, 2014.
International Search Report and Written Opinion for International Application No. PCT/US2015/058999, mailed Feb. 29, 2016.
Office Action in U.S. Appl. No. 14/705,476, mailed Sep. 2, 2016.
Notice of Allowance in U.S. Appl. No. 14/705,476 mailed Dec. 20, 2016.
Notice of Allowance in U.S. Appl. No. 13/955,617 mailed Sep. 23, 2016.
Office Action in U.S. Appl. No. 14/705,381, mailed Sep. 9, 2016.
Office Action in U.S. Appl. No. 14/952,451, mailed Sep. 16, 2016.
Notice of Allowance in U.S. Appl. No. 14/952,451, mailed Jan. 18, 2017.
Notice of Allowance in U.S. Appl. No. 14/705,381, mailed Jan. 23, 2017.

(56) References Cited

OTHER PUBLICATIONS

International Preliminary Report on Patentability for International Application No. PCT/US2015/059018, dated Jun. 15, 2017.

\* cited by examiner

APPARATUS AND METHODS FOR TUNABLE FILTERS

BACKGROUND

Field

Embodiments of the invention relate to electronic systems and, in particular, to tunable filters for radio frequency (RF) electronics.

Description of the Related Technology

A radio frequency (RF) system can include filters for filtering RF signals. For example, an RF front-end can include one or more filtering structures, such as surface acoustic wave (SAW) filters, bulk acoustic wave (BAW) filters, and/or thin film bulk acoustic resonators (FBARs).

The filters can be used to provide filtering to particular RF bands or channels. For example, the filters can have a fixed filtering characteristic versus frequency, such as a passband positioned to pass a particular band or channel while attenuating other bands or channels.

SUMMARY

In one aspect, a tunable filter includes a laminated substrate and a semiconductor die. The laminated substrate includes a first vector inductor. The first vector inductor includes a stack of conductors including two or more conductors arranged on different conductive layers of the laminated substrate. Each of the different conductive layers is separated by a dielectric. The two or more conductors are electrically connected to one another along a first side of the stack, and the two or more conductors are electrically connected to one another along a second side of the stack opposite the first side. The semiconductor die is attached to the laminated substrate, and includes a first variable capacitor. The first variable capacitor and the first vector inductor are electrically connected to operate as a first tunable resonator.

In another aspect, a radio frequency system includes a phone board and a multi-chip module attached to the phone board. The multi-chip module includes a laminated substrate including a first vector inductor integrated therein. The first vector inductor includes a stack of conductors including two or more conductors arranged on different conductive layers of the laminated substrate. Each of the different conductive layers is separated by a dielectric. The two or more conductors are electrically connected to one another along a first side of the stack, and the two or more conductors are electrically connected to one another along a second side of the stack opposite the first side. The multi-chip module further includes a semiconductor die attached to the laminated substrate, and the semiconductor die includes a first variable capacitor. The first variable capacitor and the first vector inductor are electrically connected to operate as a first tunable resonator.

In another aspect, a tunable filter is provided. The tunable filter includes a substrate, a first surface mount inductor attached to the substrate, and a semiconductor die attached to the substrate. The semiconductor die includes a first variable capacitor array and a bias voltage generation circuit configured to bias the first variable capacitor array to control a capacitance of the first variable capacitor array. The first variable capacitor array includes a first plurality of metal oxide semiconductor (MOS) variable capacitor cells. The first plurality of MOS variable capacitor cells includes a first MOS variable capacitor cell including a first MOS capacitor and a second MOS capacitor. The first MOS capacitor and the second MOS capacitor are arranged in an anti-series configuration or in an anti-parallel configuration. The first variable capacitor array and the first surface mount inductor are electrically connected to operate as a first tunable resonator.

DETAILED DESCRIPTION OF EMBODIMENTS

Figure 1:
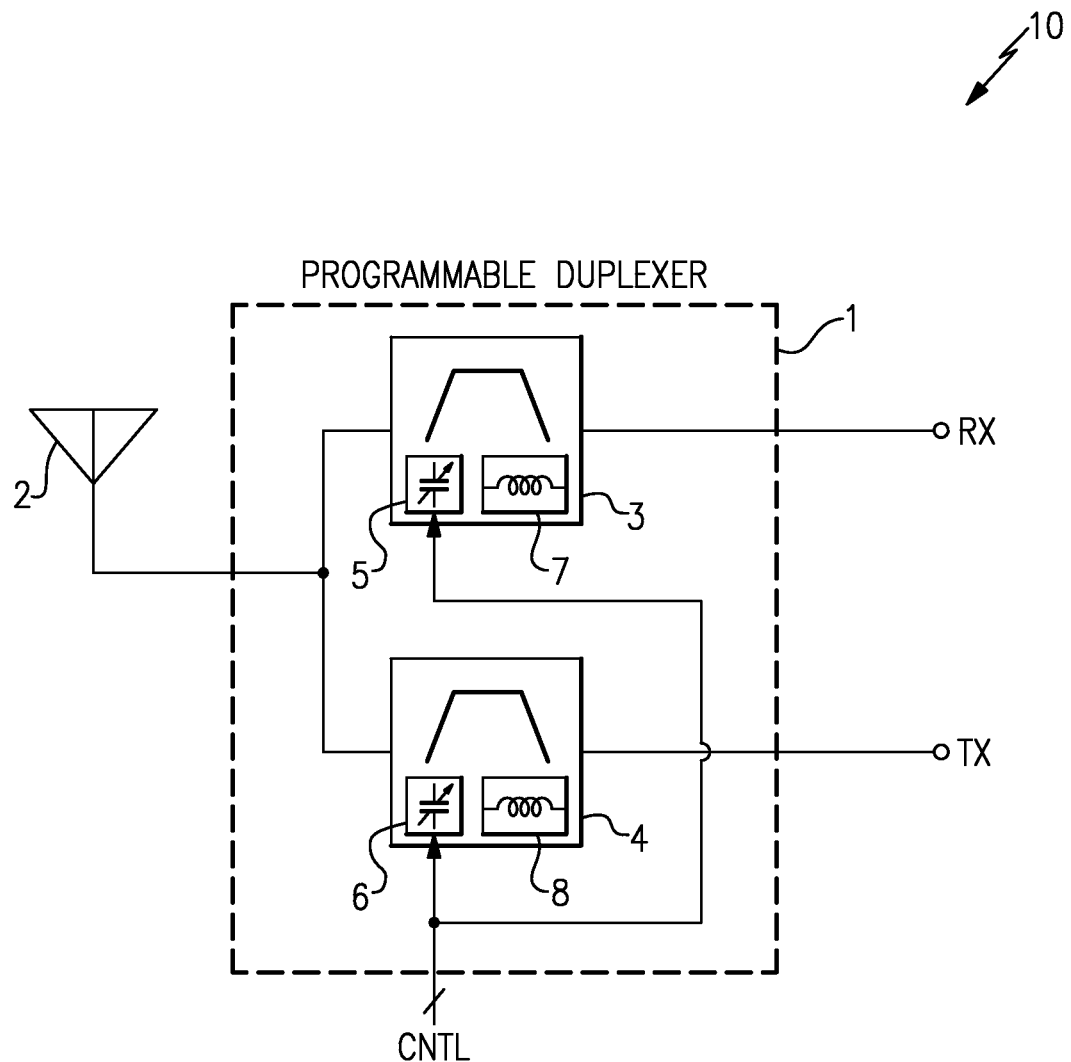
FIG. 1 is a schematic diagram of one embodiment of a radio frequency (RF) system.

The following detailed description of certain embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Provided herein are apparatus and methods for tunable filters. In certain configurations, a tunable or programmable filter includes a semiconductor die attached to a laminated substrate, such as a substrate of a multi-chip module (MCM). The tunable filter includes a vector inductor implemented using two or more conductors arranged on different conductive layers of the laminated substrate. The vector inductor's conductors are inductively coupled to one another and electrically connected in parallel to provide the vector inductor with high quality factor (Q-factor). The semiconductor die includes a variable capacitor that is electrically connected with the vector inductor to operate as a tunable resonator. Additionally, a frequency characteristic of the tunable filter, such as a passband, can be controlled by selecting a capacitance value of the variable capacitor to tune a resonance of the resonator.

The tunable filter can be used to avoid the rigidity of a passive filtering structure. For example, in certain implementations, the tunable filter can have a frequency response characteristic that can be digitally programmed, thereby allowing the tunable filter to provide filtering for one or more frequency channels. The tunable filter can be used to reduce cost, size, and/or power of a variety of RF systems, such as RF front-ends. For example, the programmable filter can enable a mobile device such as a handset to operate using a common platform across operators and/or to operate using additional bands without re-design or a change to hardware components. Thus, the tunable filter can facilitate faster time to market and/or reduce inventory or distribution costs. Furthermore, the tunable filter can operate over a wide range of frequencies, including frequency bands or channels associated with the proliferation of long term evolution (LTE) communications.

In certain configurations, the tunable filter can be used to provide filtering for two or more frequency carriers to provide carrier aggregation. For example, the tunable filter can two or more tunable resonators tuned to different frequency carriers, such that the tunable filter passes channels associated with two or more carriers.

The tunable filters herein can exhibit enhanced performance, such as finer frequency tuning and/or asymmetric rejection of out-of-band signals relative to certain conventional filters. For example, the tunable filter's vector inductor can include conductors inductively coupled to one another with high mutual inductance and electrically connected in parallel with one another to provide low resistance. Additionally, mutual coupling between the conductors in the stack can result in the vector inductor having an overall inductance that is similar to that of a self-inductance of an individual conductor in the stack. Accordingly, in certain implementations, a number of conductors in the vector inductor's stack may not affect the overall inductance of the vector inductor, but a vector inductor with a large number of conductors in a stack can have a lower resistance and higher Q-factor. Thus, including a vector inductor in a tunable filter can improve tuning performance.

In certain configurations, the variable capacitor is implemented using a variable capacitor array and a bias voltage generation circuit. The variable capacitor array can include a plurality of metal oxide semiconductor (MOS) variable capacitor cells, which include one or more pairs of MOS capacitors implemented in anti-parallel and/or anti-series configurations. The bias voltage generation circuit generates bias voltages for biasing the variable capacitor array, and can bias the MOS capacitors of a particular MOS variable capacitor cell at a voltage level selected from discrete number of two or more bias voltage levels associated with high linearity. For example, in certain implementations, the bias voltage generation circuit can bias a particular MOS capacitor either at a first bias voltage level associated with an accumulation mode of the MOS capacitor or at a second bias voltage level associated an inversion mode of the MOS capacitor.

The variable capacitor array can have a relatively small size, a relatively high Q-factor, a relatively high linearity, and/or a relatively low insertion loss. Thus, including a variable capacitor array in a resonator can provide finer frequency tuning and/or enhanced rejection of out-of-band signals.

FIG. 1 is a schematic diagram of one embodiment of a radio frequency (RF) system 10. The RF system 10 includes a programmable duplexer 1, an antenna 2, a receive terminal RX, and a transmit terminal TX. The RF system 10 can represent a portion of a wireless device, such as a smart phone or handset. Accordingly, although not illustrated in FIG. 1 for clarity, the RF system 10 can include additional components and/or circuitry.

As shown in FIG. 1, the programmable duplexer 1 includes a first tunable filter 3 and a second tunable filter 4. The first tunable filter 3 includes an input electrically connected to the antenna 2 and an output electrically connected to the receive terminal RX. The first tunable filter 3 further includes a first variable capacitor 5 and a first vector inductor 7, which are electrically connected to operate as a first tunable resonator. The capacitance of the first variable capacitor 5 can control a filtering characteristic of the first tunable filter 3, such as the location in frequency of a passband. The second tunable filter 4 includes an input electrically connected to the transmit terminal TX and an output electrically connected to the antenna 2. The second tunable filter 4 further includes a second variable capacitor 6 and a second vector 8, which are electrically connected to operate as a second tunable resonator. The second variable capacitor's capacitance can be selected to control a filtering characteristic of the second tunable filter 4.

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

Certain conventional wireless devices can include a multi-throw switch and a duplexer associated with each of the frequency bands, and the multi-throw switch can be used to selectively couple an antenna to a duplexer associated with a particular band. The duplexers can provide band filtering using, for example, passive filtering structures, such as a surface acoustic wave (SAW) filters, bulk acoustic wave (BAW) filters, and/or thin film bulk acoustic resonators (FBARs). The multi-throw switch can be used to electrically couple the antenna to a duplexer associated with a frequency band that the wireless device is transmitting and/or receiving over at a particular time instance.

In the illustrated configuration, the programmable duplexer 1 can be configured to filter a particular frequency band by programming the first and second tunable filters 3, 4 using a control signal CNTL. For example, in certain embodiments, the capacitance value of the first variable capacitor 5 can be controlled using the control signal CNTL to control a frequency location of a passband of the first tunable filter 3, and the capacitance value of the second variable capacitor 6 can be controlled using the control signal CNTL to control a frequency location of a passband of the second tunable filter 4.

Accordingly, the programmable duplexer 1 can be used to provide the RF system 10 with multi-band capability, while avoiding a need for using a multi-throw switch and a duplexer for each frequency band. Including the programmable duplexer 1 in the RF system 10 can reduce insertion loss in transmit and/or receive paths by eliminating a need for a multi-throw switch. Furthermore, the programmable duplexer 1 can have smaller area relative to a configuration including a multi-throw switch and multiple duplexers. Thus, a wireless device that includes the programmable duplexer 1 can have a smaller form factor and/or lower cost.

In the illustrated configuration, the capacitance values of the first and second variable capacitors 5, 6 can be controlled using the control signal CNTL. In one embodiment, the control signal CNTL is received by the programmable duplexer 1 over an interface, such as a serial peripheral interface (SPI) or Mobile Industry Processor Interface radio frequency front end (MIPI RFFE) interface. Although two examples of interfaces have been provided, other interfaces can be used. Although FIG. 1 illustrates the first and second variable capacitors 5, 6 as receiving a common control signal CNTL, other configurations are possible, such as implementations in which the first and second variable capacitors 5, 6 are controlled using separate control signals. In certain configurations, the first variable capacitor 5 and/or the second variable capacitor 6 are implemented using one or more ICs that include variable capacitor arrays.

The first and second vector inductors 7, 8 can provide higher Q-factor and/or smaller area relative to certain other inductive structures, such as spiral or coil inductors. Although the RF system 10 illustrates one example of a system that can include one or more vector inductors, the vector inductors described herein can be used in other systems.

Figure 2A:
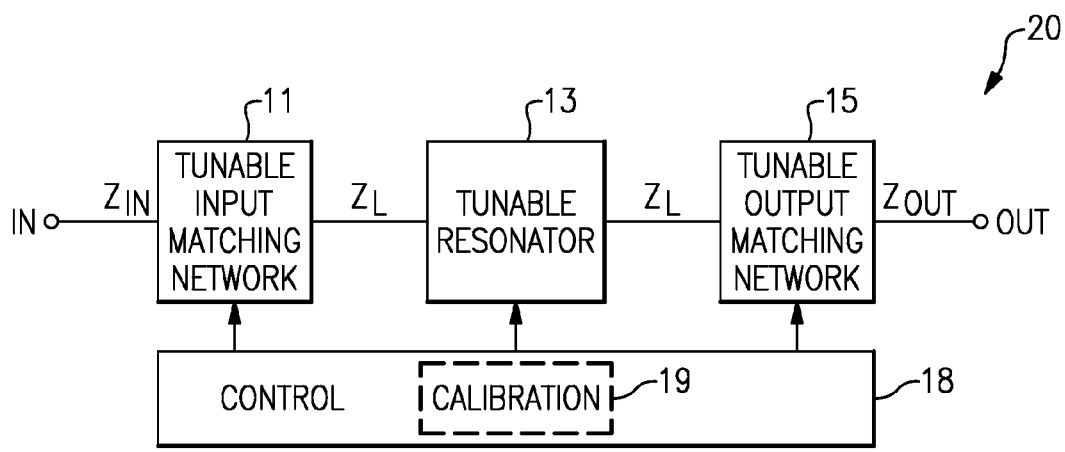
FIG. 2A is a schematic diagram of a tunable filter according to one embodiment.

FIG. 2A is a schematic diagram of a tunable filter 20 according to one embodiment. The tunable filter 20 includes a tunable input impedance matching network 11, a tunable resonator 13, a tunable output impedance matching network 15, and a control circuit 18. The tunable filter 20 further includes an RF input IN and an RF output OUT.

The tunable filter 20 illustrates one embodiment of a tunable filter suitable for implementing the first and/or second tunable filters 3, 4 shown in FIG. 1. However, the tunable filter 20 can be used in other systems and/or the first and/or second tunable filters 3, 4 can be implemented in other ways.

The tunable input impedance matching network 11 can receive an RF input signal on the RF input IN, and can generate an impedance transformed signal for the tunable resonator 13. Thus, the tunable input impedance matching network 11 can provide an impedance transformation from input to output. For example, in one embodiment, the input impedance transformer 11 transforms an input impedance $Z_{IN}$ of about 50Ω to an output impedance of about $Z_L$, where $Z_L$ is less than 50Ω, for example, 8Ω.

Transforming the input impedance of the tunable filter 20 in this manner can result in the impedance transformed signal having a smaller voltage level relative to a voltage level of the RF input signal received at the RF input IN. For example, when the tunable filter 20 has an input impedance $Z_L$, the voltage level of the impedance transformed signal can be smaller than the voltage level of the RF input signal by a factor of about $\sqrt{Z_{IN}/Z_L}$.

The tunable input matching network 11 receives an input matching control signal from the control circuit 18. The input matching control signal can be used for a variety of purposes, including, for example, to control input impedance to enhance performance for a particular band, or under varying voltage standing wave ratio (VSWR). In certain configurations, the input matching control signal can also be used to control a ratio of impedance transformation provided by the tunable input matching network 11.

As shown in FIG. 2A, the tunable resonator 13 can receive the impedance transformed signal from the tunable input matching network 11, and can be used to generate a filtered signal for the tunable output matching network 15. The tunable resonator 13 receives a resonator control signal, which can be used to control one or more resonant frequencies of the tunable resonator. By controlling the resonance of the tunable resonator 13, the tunable filter 20 can achieve a desired gain versus frequency response. In certain configurations, the resonator control signal is used to control a capacitance of a variable capacitor, thereby controlling the tunable resonator's resonant frequency.

The output impedance matching network 15 receives the filtered signal from the tunable resonator 13, and generates the RF output signal on the RF output OUT. In certain configurations, the output impedance matching network 15 can provide an impedance transformation from the impedance $Z_L$ to an output impedance $Z_{OUT}$ that is greater than $Z_L$. In certain implementations, the output impedance $Z_{OUT}$ can be selected to be about 50Ω. The tunable output matching network 15 receives an output matching control signal from the control circuit 18. The output matching control signal can be used for a variety of purposes, including, for example, to control output impedance to enhance output matching and/or to control a ratio of impedance transformation provided by the tunable output matching network 15.

Although the tunable filter's input impedance $Z_{IN}$ and output impedance $Z_{OUT}$ can be the same in certain configurations, for instance, about 50Ω, the teachings herein are also applicable to configurations in which a tunable filter's input impedance $Z_{IN}$ and output impedance $Z_{OUT}$ are different.

As shown in FIG. 2A, the control circuit 18 can include a calibration circuit 19, which can be used to control provide calibration to the tunable resonator 13, the tunable input matching network 11, and/or the tunable output matching network 15. In certain configurations, the calibration circuit 19 can be used to compensate for variation of the tunable resonator 13, the tunable input matching network 11, and/or the tunable output matching network 15, such as variation associated with processing and/or temperature. For example, the control circuit 18 can generate control signals that can be used to select capacitance values of variable capacitors of the tunable filter 20, and the calibration circuit 19 can be used to adjust the value of the control signals to provide compensation. In certain configurations, the calibration can be band and/or carrier specific to compensate for variation in the errors across frequency.

The tunable resonator 13 can be used to narrow-band match the tunable filter 20 to a particular frequency band or carrier. Thus, in contrast to certain passive filtering structures, such as SAW filters, BAW filters, and/or FBARs, the tunable filter 20 can exhibit greater frequency selectivity and lower insertion loss when tuned to a particular frequency. The selectivity can be enhanced by using high Q-factor vector inductors and/or high Q-factor variable capacitors in the tunable resonator 13.

For instance, the tunable filter 20 can include vector inductors that include a stack of mutually coupled inductors electrically connected in parallel to provide low resistance and high Q-factor, which in turn can lower the tunable filter's insertion loss and enhance the tunable filter's frequency selectivity. Additionally, the tunable filter 20 can include a variable capacitor array including MOS variable capacitor cell that include on or more pairs of MOS capacitors implemented in anti-parallel and/or anti-series configurations. Additionally, the MOS capacitors of a particular MOS variable capacitor cell can be biased at selected voltage levels to provide high linearity, and can operate without requiring switches in RF signal paths to control active capacitor cells. Thus, the variable capacitor array can have a relatively high Q and a relatively low insertion loss, and thus can lower insertion loss and increase frequency selectivity when included in a tunable filter.

Although including vector inductors and variable capacitor arrays can enhance performance of the tunable filter 20, various implementations of the tunable input matching network 11, the tunable resonator 13, and the tunable output matching network 15 are possible to achieve a specific performance desired for a particular RF system and/or application.

In one embodiment, the tunable input matching network 11 is implemented using a combination of a surface mount technology (SMT) inductor and a variable capacitor array, using a combination of a vector inductor and any suitable variable capacitor, and/or using a combination of a vector inductor and a variable capacitor array. Additionally, in one embodiment, the tunable resonator 13 is implemented using a combination of an SMT inductor and a variable capacitor array, using a combination of a vector inductor and any suitable variable capacitor, and/or using a combination of a vector inductor and a variable capacitor array. Furthermore, in one embodiment, the tunable output matching network 15 is implemented using a combination of an SMT inductor and a variable capacitor array, using a combination of a vector inductor and any suitable variable capacitor, and/or using a combination of a vector inductor and a variable capacitor array.

Figure 2B:
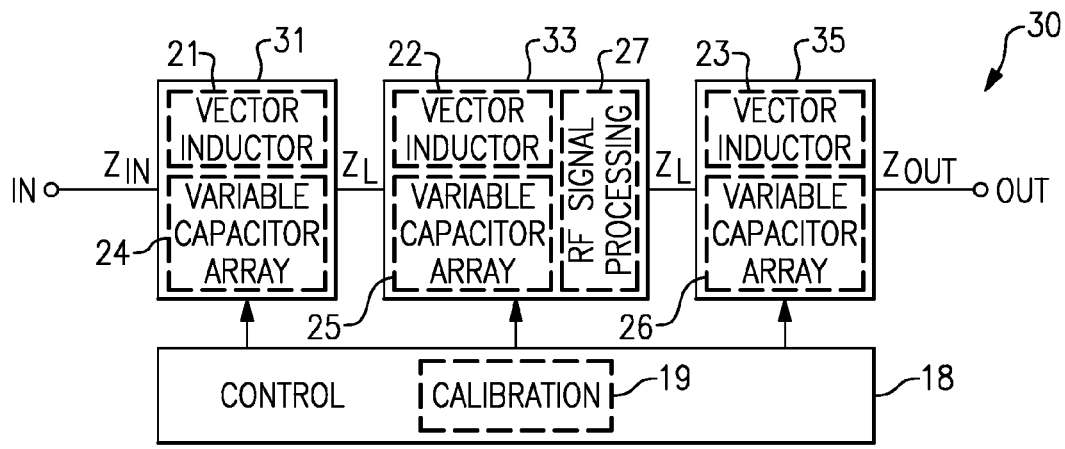
FIG. 2B is a schematic diagram of a tunable filter according to another embodiment.

FIG. 2B is a schematic diagram of a tunable filter 30 according to another embodiment. The tunable filter 30 includes a tunable input impedance matching network 31, a tunable resonator 33, a tunable output impedance matching network 35, and a control circuit 18.

The tunable filter 30 of FIG. 2B is similar to the tunable filter 20 of FIG. 2A, except that the tunable filter 30 of FIG. 2B illustrates a specific implementation of the tunable input impedance matching network 31, the tunable resonator 33, and the tunable output impedance matching network 35.

In particular, the illustrated tunable input impedance matching network 31 includes a first vector inductor 21 and a first variable capacitor array 24. Additionally, the illustrated tunable resonator 33 includes a second vector inductor 22, a second variable capacitor array 25, and an RF signal processing circuit 27, which can be used to process RF signals in a wide variety of ways. Furthermore, the illustrated output impedance matching network 35 includes a third vector inductor 23 and a third variable capacitor array 26.

Including vector inductors and/or variable capacitor arrays in a tunable filter can increase the tunable filter's Q-factor, enhance the tunable filter's frequency selectivity, and/or lower the tunable filter's insertion loss. For example, vector inductors and variable capacitor arrays can have high Q-factor and low resistance, and thus can provide narrow-band selectivity and a relatively small amount of signal loss.

Although FIG. 2B illustrates a configuration in which each of the tunable input impedance matching network 31, the tunable resonator 33, and the tunable output impedance matching network 35 includes a vector inductor and a variable capacitor array, other configurations are possible. For example, one or more of the vector inductors can be omitted in favor of using a surface mount inductor. Additionally, one or more of the variable capacitor arrays can be omitted in favor of using other variable capacitance structures. Furthermore, the teachings herein are applicable to configurations in which the tunable input impedance matching network 31, the tunable resonator 33, and/or the tunable output impedance matching network 35 includes multiple vector inductors and/or multiple variable capacitor arrays.

Additional details of the tunable filter 30 can be similar to those described earlier.

Figure 2C:
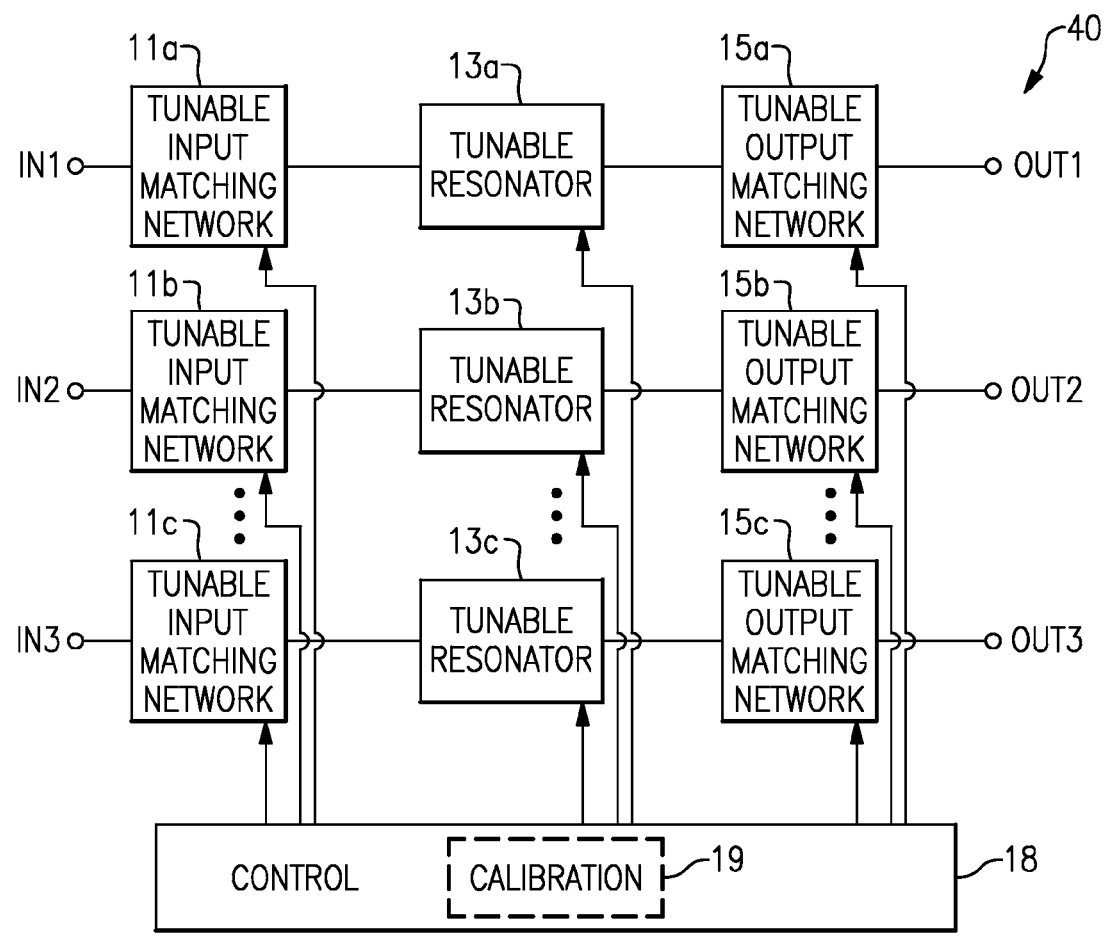
FIG. 2C is a schematic diagram of a tunable filter according to another embodiment.

FIG. 2C is a schematic diagram of a tunable filter 40 according to another embodiment. The tunable filter 40 includes a first tunable input impedance matching network 11a, a second tunable input impedance matching network 11b, a third tunable input impedance matching network 11c, a first tunable resonator 13a, a second tunable resonator 13b, a third tunable resonator 13c, a first tunable output impedance matching network 15a, a second tunable output impedance matching network 15b, a third tunable output impedance matching network 15c, and a control circuit 18. The tunable filter 40 further includes a first RF input IN1, a second RF input IN2, a third RF input IN3, a first RF output OUT1, a second RF output OUT2, and a third RF output OUT3.

Although FIG. 2C illustrates a tunable filter that provides filtering on three RF signal pathways, the tunable filter can be adapted to provide filtering of more or fewer RF signal pathways.

The first tunable input impedance matching network 11a can provide input matching and/or impedance transformation for the first RF input IN1. Similarly, the second tunable input impedance matching network 11b can be used to provide input matching and/or impedance transformation for the second RF input IN2, and the third tunable input impedance matching network 11c can be used to provide input matching and/or impedance transformation for the third RF input IN3. The control circuit 18 can be used to control input impedance matching and/or to control ratios of impedance transformation provided by the tunable input matching networks 11a-11c.

The first tunable output impedance matching network 15a can provide output matching and/or impedance transformation for the first RF output OUT1. Similarly, the second tunable output impedance matching network 15b can be used to provide output matching and/or impedance transformation for the second RF output OUT2, and the third tunable output impedance matching network 15c can be used to provide output matching and/or impedance transformation for the third RF output OUT3. The control circuit 18 can be used to control output impedance matching and/or to control ratios of impedance transformation provided by the tunable output matching networks 15a-15c.

As shown in FIG. 2C, the first tunable resonator 13a can provide filtering between the first RF input IN1 and the first RF output OUT1. Additionally, the second tunable resonator 13b can provide filtering between the second RF input IN2 and the second RF output OUT2, and the third tunable resonator 13c can provide filtering between the third RF input IN3 and the third RF output OUT3. The control circuit 18 can be used to control one or more resonant frequencies of the tunable resonators 13a-13c to achieve a desired gain versus frequency response.

Additional details of the tunable filter 40 can be similar to those described earlier.

Although FIGS. 2A-2C illustrate embodiments of tunable filters that include input and output impedance matching networks, the teachings herein are also applicable to configurations of tunable filters in which the input and/or output impedance matching networks are omitted.

Figure 3A:
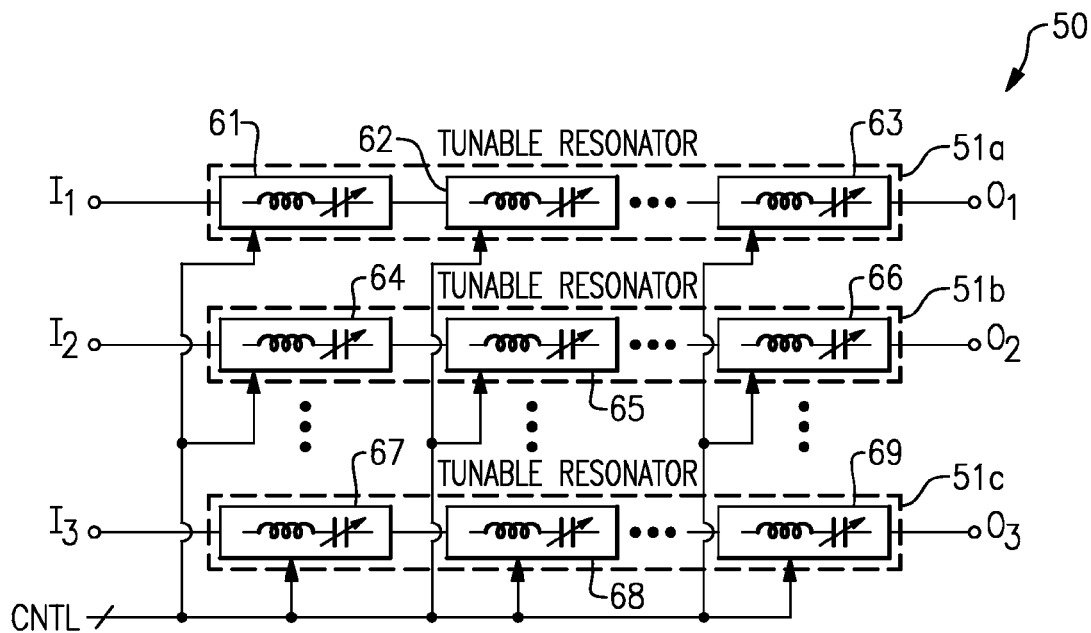
FIG. 3A is a schematic diagram of one embodiment of a tunable resonator array.

FIG. 3A is a schematic diagram of one embodiment of a tunable resonator array 50. The tunable resonator array 50 includes a first tunable resonator 51a, a second tunable resonator 51b, and a third tunable resonator 51c.

The first tunable resonator 51a includes a cascade of a first tunable series resonator 61, a second tunable series resonator 62, and a third tunable series resonator 63 between a first RF input $I_1$ and a first RF output $O_1$. Additionally, the second tunable resonator 51b includes a cascade of a fourth tunable series resonator 64, a fifth tunable series resonator 65, and a sixth tunable series resonator 66 between a second RF input $I_2$ and a second RF output $O_2$. Furthermore, the third tunable resonator 51c includes a cascade of a seventh tunable series resonator 67, an eighth tunable series resonator 68, and a ninth tunable series resonator 69 between a third RF input $I_3$ and a third RF output $O_3$.

Although the tunable resonator array 50 of FIG. 3A is illustrated as including three tunable resonators, the tunable resonator array 50 can be adapted to include more or fewer tunable resonators. Additionally, although the tunable resonators 51a-51c are illustrated as including a cascade of three tunable series resonators, other configurations are possible, such as configurations including more or fewer tunable series resonators, and/or a combination of tunable series resonators and parallel series resonators.

As shown in FIG. 3A, the tunable resonator array 50 receives the control signal CNTL, which can be used to control a variable capacitance associated with the first to ninth tunable series resonators 61-69. By controlling the tunable series resonators' capacitances, a frequency response of the tunable resonator array 50 can be tuned. Although FIG. 3A illustrates a configuration in which the first to ninth tunable series resonators 61-69 are controlled using a common control signal, the teachings herein are also applicable to configurations in which two or more control signals are used to tune resonators.

The tunable resonator array 50 can be used in a tunable filter, such as the tunable filter 40 of FIG. 2C. For example, the tunable resonator array 50 can be used to implement the tunable resonators 13a-13c of FIG. 2C.

Additional details of the tunable resonator array 50 can be similar to those described earlier.

Figure 3B:
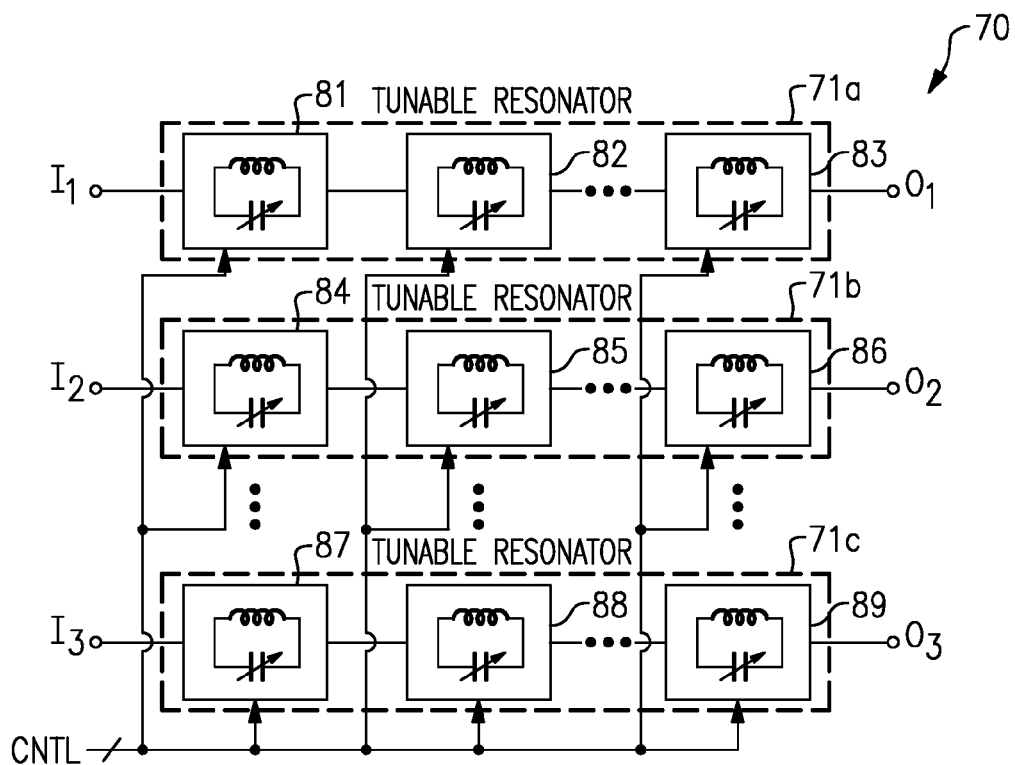
FIG. 3B is a schematic diagram of another embodiment of a tunable resonator array.

FIG. 3B is a schematic diagram of another embodiment of a tunable resonator array 70. The tunable resonator array 70 includes a first tunable resonator 71a, a second tunable resonator 71b, and a third tunable resonator 71c.

The tunable resonator array 70 of FIG. 3B is similar to the tunable resonator array 50 of FIG. 3A, except that the tunable resonator array 70 includes a different configuration of tunable resonators 71a-71c. In particular, in contrast to the tunable resonators 51a-51c of FIG. 3A which each include a cascade of tunable series resonators, the illustrated tunable resonators 71a-71c each include a cascade of tunable parallel resonators.

For example, the first tunable resonator 71a includes a cascade of a first tunable parallel resonator 81, a second tunable parallel resonator 82, and a third tunable parallel resonator 83. Additionally, the second tunable resonator 71b includes a cascade of a fourth tunable parallel resonator 84, a fifth tunable parallel resonator 85, and a sixth tunable parallel resonator 86. Furthermore, the third tunable resonator 71c includes a cascade of a seventh tunable parallel resonator 87, an eighth tunable parallel resonator 88, and a ninth tunable parallel resonator 89.

Although the tunable resonator array 70 of FIG. 3B is illustrated as including three tunable resonators, the tunable resonator array 70 can be adapted to include more or fewer tunable resonators. Additionally, although the tunable resonators 71a-71c are illustrated as including a cascade of three tunable parallel resonators, other configurations are possible, such as configurations including more or fewer tunable parallel resonators. Moreover, the teachings herein are applicable to configurations in which a tunable resonator array includes both series tunable resonators and parallel tunable resonators.

Additional details of the tunable resonator array 70 can be similar to those described earlier.

Figure 4A:
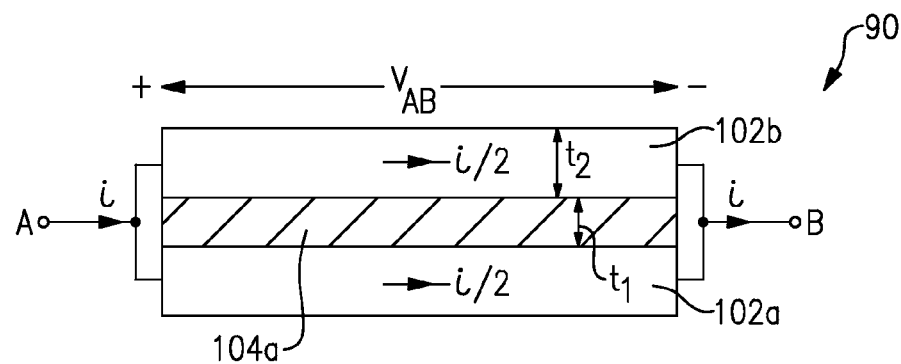
FIG. 4A is a cross section of a portion of a vector inductor according to one embodiment.

FIG. 4A is a cross section of a portion of a vector inductor according to one embodiment. The portion of the vector inductor or inductive structure 90 includes a first conductor 102a and a second conductor 102b, which are separated by a first dielectric region 104a.

As shown in FIG. 4A, a first terminal A is electrically connected to a first end of the first conductor 102a and to a first end of the second conductor 102b. Additionally, a second terminal B is electrically connected to a second end of the first conductor 102a and to a second end of the second conductor 102b.

The inductive structure 90 has been annotated to include a voltage $V_{AB}$ between the first terminal A and the second terminal B and to illustrate a current i flowing therethrough. As shown in FIG. 4A, a first current having a magnitude about equal to i/2 can flow through the first conductor 102a, and a second current having a magnitude about equal to i/2 can flow through the second conductor 102b.

In certain configurations, the voltage $V_{AB}$ across the inductive structure 90 can be given by Equation 1 below, where L is equal to the self-inductance of the first conductor 102a and of the second conductor 102b, and M is equal to the mutual inductance between the first and second conductors 102a, 102b.

$$V_{AB} = L\frac{d\frac{i}{2}}{dt} + M\frac{d\frac{i}{2}}{dt} = \left(\frac{L}{2} + \frac{M}{2}\right)\frac{di}{dt} \qquad \text{Equation 1}$$

The mutual inductance M between a first inductor of self-inductance $L_1$ and a second inductor of self-inductance $L_2$ can be about equal to $k\sqrt{L_1 * L_2}$, where k is the coupling coefficient between the inductors. In the illustrated configuration, the first and second conductors 102a, 102b have about equal self-inductance L, and thus the mutual inductance M can be about equal to k*L, where k is equal to the coupling coefficient between the first and second conductors 102a, 102b. Accordingly, in certain implementations, the voltage $V_{AB}$ across the inductive structure 90 can be given by Equation 2 below.

$$V_{AB} = \left(\frac{L}{2} + \frac{kL}{2}\right)\frac{di}{dt} \approx L\frac{di}{dt} \text{ for } k \approx 1 \qquad \text{Equation 2}$$

Accordingly, a pair of conductors each having a self-inductance L, can have an overall inductance that is also about equal to L when the conductors are tightly coupled, such as when the conductors are mutually coupled with a relatively high coupling coefficient, for example, a coupling coefficient of at least 0.9.

In certain implementations, the dielectric regions between adjacent conductors can be relatively thin, such that adjacent conductors exhibit a high degree of mutual coupling. In one embodiment, a thickness $t_1$ of the first dielectric region 104a is selected to be in the range of about 8 µm to about 50 µm. In certain configurations, the dielectric regions between conductors have a thickness that is less a thickness of the conductors. For example, in one embodiment, the conductors have a thickness $t_2$ that is in the range of about 16 µm to about 32 µm. Although examples of specific thicknesses of conductors and dielectric regions have been provided, other configurations are possible.

Although an overall inductance of the pair of conductors can be about equal to a self-inductance of an individual one of the conductors, the resistance of the inductive structure 90 can be smaller than a resistance of an individual conductor. For example, when the first and second conductors 102a, 102b each have a resistance R, an overall resistance between the first terminal A and the second terminal B can be about equal to R/2.

When additional conductors are added to the stack, resistance can further decrease. However, the overall inductance can remain about equal to L when the conductors are tightly coupled to one another via mutual induction.

Figure 4B:
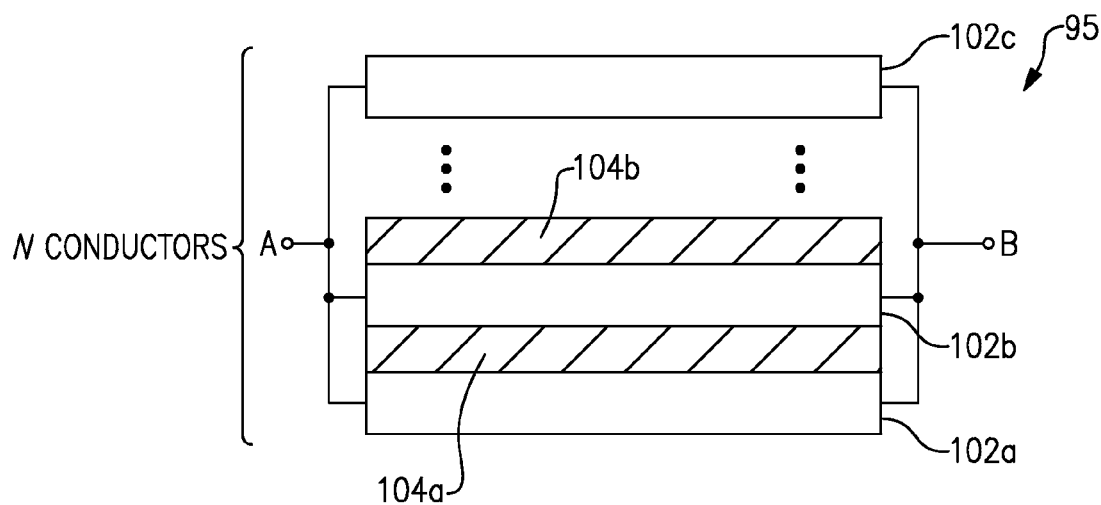
FIG. 4B is a cross section of a vector inductor according to one embodiment.

FIG. 4B is a cross section of a vector inductor 95 according to one embodiment. The vector inductor 95 is illustrated as including a first conductor 102a, a second conductor 102b, and a third conductor 102c, with the first and second conductors 102a, 102b separated by a first dielectric region 104a and with the second and third conductors 102b, 102c separated by a second dielectric region 104b. However, as indicated by the ellipses, the vector inductor 95 can include N conductors. N can vary in a broad range.

In one embodiment, a vector inductor includes a stack of N conductors, where N is selected to be in the range of about 2 conductors and about 16 conductors. As used herein, a first conductor in a stack of N conductors can be referred to as a lowermost conductor in the stack, while the last or Nth conductor in the stack can be referred to as an uppermost conductor in the stack. In one embodiment, a vector inductor includes a stack of three or more conductors.

As shown in FIG. 4B, the conductors 102a-102c can be arranged vertically in a stack. Additionally, adjacent conductors in the stack can be tightly coupled to one another via inductive coupling to achieve a high amount of mutual inductance. In one embodiment, adjacent conductors in a vector inductor's stack are configured to have a coupling coefficient k that is at least 0.5, or more particularly, 0.9 or greater.

Tightly coupling the conductors via inductive coupling can result in the vector inductor 95 having an overall inductance that is similar to a self-inductance of an individual conductor in the stack. However, the conductors can be electrically connected in parallel, and thus an Ohmic loss of the vector inductor 95 can decrease with an increase in the number of conductors in the stack. Accordingly, the Q-factor of a vector inductor can be increased by including additional conductors in the stack.

Moreover, a configuration including multiple conductors arranged in a stack can also provide higher conductivity for radio frequency (RF) signals relative to a configuration including a single solid conductor of similar dimension. For example, implementing the conductors in a stack can provide a greater amount of conductor surface area relative to a single solid conductor, and thus the vector inductor can provide high conductivity in the presence of skin effect.

The vector inductor 95 can also be implemented in a relatively small area relative to certain inductors of similar inductance and/or resistivity. For example, in one embodiment, the vector inductor 95 includes N conductors of self-inductance L. When the conductors of the vector inductor 95 are tightly coupled, an overall inductance of the vector inductor 95 can be about equal to L. In contrast, an inductor that operates without mutual coupling can have an overall size that is a factor of about N times greater to achieve a similar inductance. Furthermore, since the conductors are arranged in a vertical stack, the conductors can occupy an area that is about a factor of 1/N smaller relative to a planar configuration. The net result of mutual coupling and vertical integration can result in a reduction of size by a factor of about $N^2$ relative to an inductor that is implemented without layering and without mutual coupling.

In certain configurations, the vector inductor 95 can be configured to have high mutual inductance between adjacent conductors in part by using a dielectric material between the conductors that has a relatively high permittivity. As persons having ordinary skill in the art will appreciate, relative permittivity $\in_r$, can correspond to a ratio of the permittivity of a specific medium relative to the permittivity of free space $\in_0$. In one embodiment, the dielectric is implemented using a dielectric material having a relative permittivity $\in_r$ that is in the range of about 2.7 to about 10. However, other configurations are possible.

In certain configurations, the dielectric regions disposed between adjacent conductors can have low dielectric loss. For example, in one embodiment, the dielectric loss tangent (tan δ) of the dielectric regions can be selected to be much less than 1, for instance, 0.00002 or less. As persons having ordinary skill in the art will appreciate, an electromagnetic field in a dielectric can include a reactive or lossless component and a resistive or lossy component, and a dielectric with low dielectric loss tangent can have a reactive component that is much greater in magnitude than the resistive component. A dielectric with low dielectric loss tangent can also be associated with a relatively small amount of heat dissipation. Thus, selecting a dielectric with low dielectric loss tangent can aid in integrating a vector inductor in applications having stringent heat dissipation specifications, such as in certain wireless device applications.

In one embodiment, the dielectric regions comprise HL832, HL970, and/or HL972 series. Although various examples of dielectric materials have been provided, other dielectric materials are possible.

In certain configurations, a thickness of the vector inductor's dielectric regions is substantially the same. Additionally, in certain configurations, a thickness of the vector inductor's conductors is substantially the same. However, other configurations are possible, including, for example, configurations in which the thicknesses of dielectric regions are different and/or configurations in which the thicknesses of conductors are different.

In certain configurations, the vector inductor's conductors can be implemented as individual strips or patches of conductive material, such as elongated strips of metal. For example, the vector inductor's conductors can be implemented to have a substantially rectangular shape when from viewed from above the conductor stack. Configuring the conductors in a substantially rectangular shape can reduce or eliminate curves and angles to provide a relatively straight path for electron flow, which in turn can provide high Q-factor. However, as will be described in detail below, other configuration are possible, including, for example, configurations in which the vector inductor's conductors are curved to aid in providing a connection to a variable capacitor to provide a parallel resonator.

Certain conventional inductors are implemented in a coil or spiral shape. However, a path for current flow in such structures can be steeply curved or angled. Thus, electrons associated with currents flowing through such inductors may tend to localize along the innermost edge of the coil or spiral at high frequencies, which can degrade the inductor's Q-factor.

Although increasing a size of an inductor's conductor may increase Q-factor, such an approach can undesirably increase the inductor's area. Additionally, an ability to increase Q-factor by increasing conductor size may be limited by the skin effect. As persons having ordinary skill in the art will appreciate, the skin effect is a tendency of a radio frequency signal propagating via a conductor to have a current density near the surface of the conductor, rather than through an entire thickness of the conductor.

The vector inductors herein can have a relatively high Q-factor, a relatively high linearity, and/or a relatively low insertion loss. Additionally, the vector inductors can have a relatively high inductance per unit area, and thus can occupy a relatively small physical space or area.

In certain configurations, a vector inductor can be integrated into a laminated substrate, such as a substrate of a multi-chip module (MCM).

The vector inductor can be configured to operate in an inductor-capacitor (LC) resonator with a variable capacitor. Additionally, the capacitance of the variable capacitor can be selected to provide frequency tuning to a tunable filter.

Figure 5A:
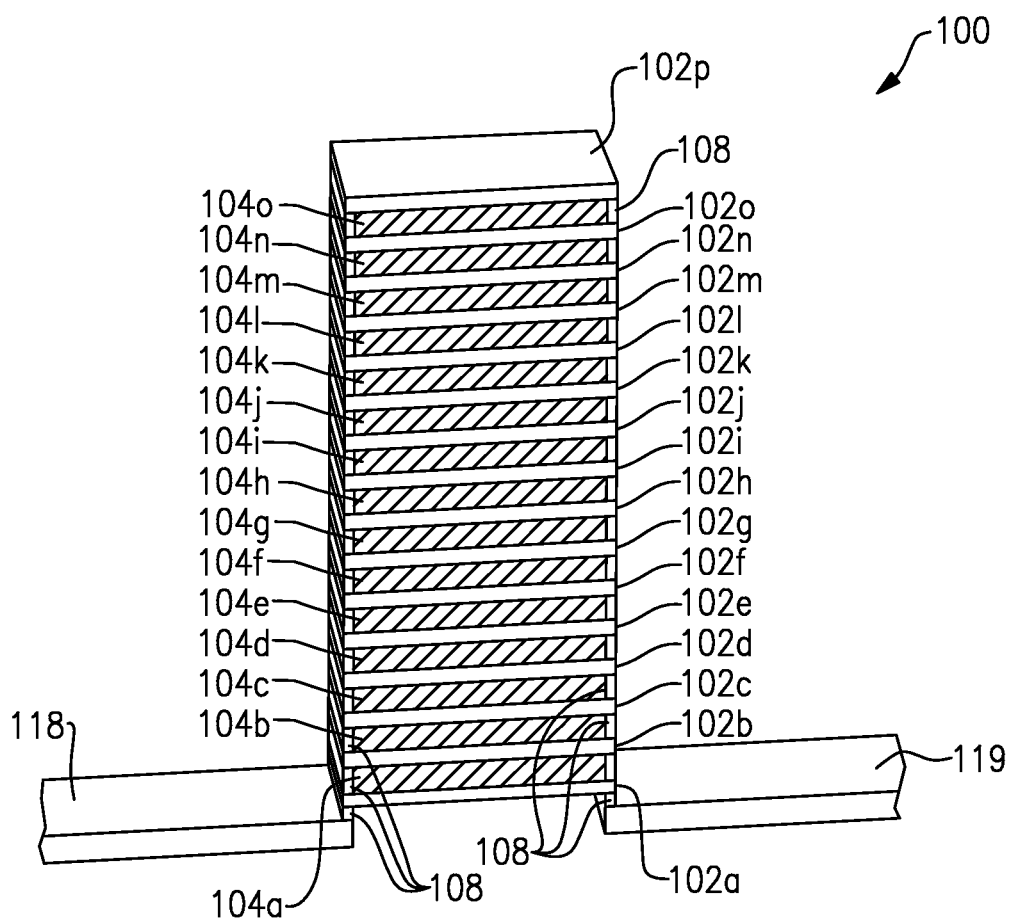
FIG. 5A is a perspective view of a vector inductor according to one embodiment.

FIG. 5A is a perspective view of a vector inductor 100 according to one embodiment. The vector inductor 100 includes first to sixteenth conductors 102a-102p, respectively. The vector inductor 100 further includes first to fifteenth dielectric regions 104a-104o, respectively. The vector inductor 100 further includes conductive sidewalls 108, a first terminal 118, and a second terminal 119.

Although the vector inductor 100 is illustrated as including sixteen conductors, the teachings herein are applicable to vector inductors including more or fewer conductors.

Although not illustrated in FIG. 5A for clarity of the figures, the vector inductor 100 is implemented within a laminated substrate, such as a substrate of a multi-chip module (MCM). Additionally, the first to sixteenth conductors 102a-102p can correspond to conductive layers of the laminated substrate.

Figure 5B:
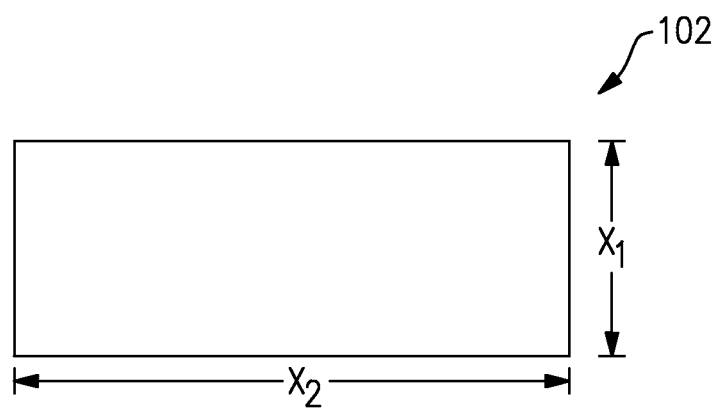
FIG. 5B is a plan view of a conductor of the vector inductor of FIG. 5A.

FIG. 5B is a plan view of a conductor 102 of the vector inductor 100 of FIG. 5A. The conductor 102 can correspond to an overhead view of any of the conductors 102a-102p of FIG. 5A.

As shown in FIG. 5B, the conductor 102 has a substantially rectangular shape when viewed from above the vector inductor's stack. Configuring the conductor 102 in this manner can enhance conductivity at high frequencies by providing a relatively straight path for current flow, which in turn can increase Q-factor.

In one embodiment, the conductor 102 has a height $X_1$ in the range of about 250 μm to about 2,000 μm, and a width $X_2$ in the range of about 1000 μm to about 10,000 μm. However, other configurations are possible.

While sharp angles for corners and straight lines are illustrated in the figures, those of ordinary skill in the art will appreciate that in actual embodiments, particularly with miniaturized embodiments, corners can be rounded and the "lines" can be other than straight.

Figure 6:
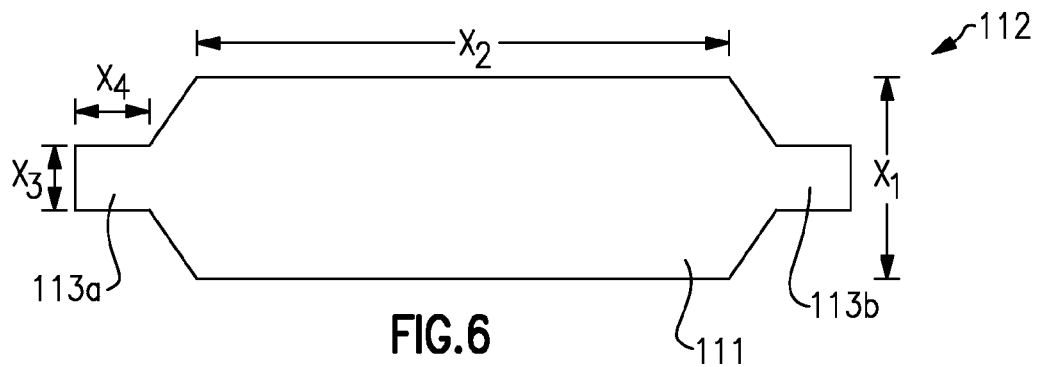
FIG. 6 is a plan view of a conductor of a vector inductor according to another embodiment.

FIG. 6 is a plan view of a conductor 112 of a vector inductor according to another embodiment.

The conductor 112 of FIG. 6 is similar to the conductor 102 of FIG. 5B, except that the conductor 112 of FIG. 6 further includes a first stub 113a and a second stub 113b, which are located on opposite ends of a conductive body 111.

The first and second stubs 113a, 113b can aid in providing impedance matching to components and/or other circuitry that is electrically connected to a vector inductor.

As shown in FIG. 6, the conductor 112 includes the conductive body 111, which can have a height $X_1$ and a width $X_2$ similar to that of conductor 112 of FIG. 5B. Additionally, the conductor 112 can have a stub height $X_3$ and a stub width $X_4$. In one embodiment, the stub height $X_3$ is in the range of about 100 μm to about 1,000 μm, and the stub width $X_4$ is in the range of 100 μm to about 1,000 μm. However, other configurations are possible.

Figure 7A:
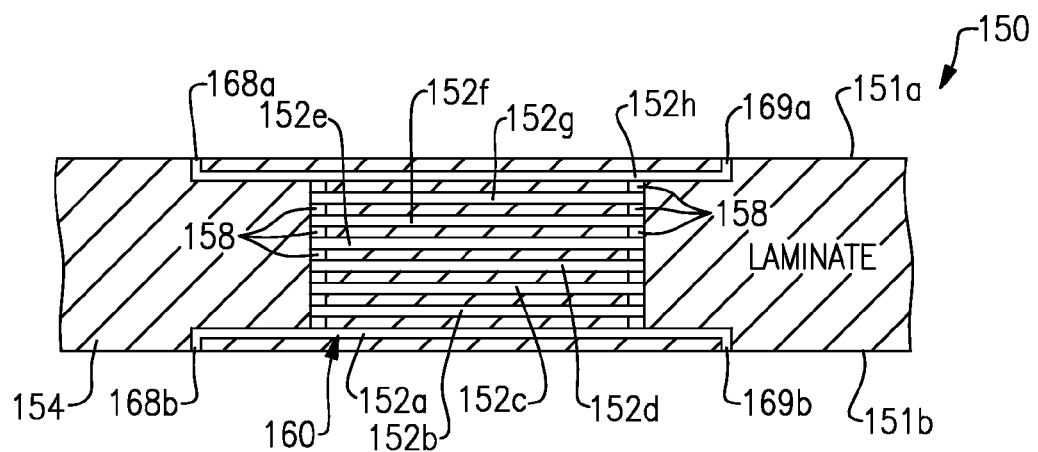
FIG. 7A is a cross section of a laminated substrate according to one embodiment.

FIG. 7A is a cross section of a laminated substrate 150 according to one embodiment. The laminated substrate 150 includes dielectric 154 and first to eighth conductors 152a-152h, which have been implemented as a vector inductor 160. As shown in FIG. 7A, the laminated substrate 150 further includes vias 158, which operate as conductive sidewalls of the vector inductor 160 to electrically connect adjacent conductors to one another along the ends of the conductors.

Although the laminated substrate 150 illustrates a vector inductor that includes eight conductors in the vector inductor's conductor stack, the teachings herein are applicable to configurations including more or fewer conductors in a stack.

The illustrated laminated substrate 150 includes a top surface 151a, which includes a first top surface inductor terminal 168a and a second top surface inductor terminal 169a. Additionally, the illustrated laminated substrate 150 includes a bottom surface 151b, which includes a first bottom surface inductor terminal 168b and a second bottom surface inductor terminal 169b.

Accordingly, the illustrated laminated substrate 150 includes a vector inductor that can be electrically connected to other circuitry on the top and/or bottom surfaces of the substrate.

Configuring the laminated substrate 150 in this manner can facilitate providing electrical connections between the vector inductor 160 and other components or circuitry. For example, integrated circuits (ICs) and/or surface mount components can be attached to the laminated substrate's top and bottom surfaces, and can be electrically connected to the vector inductor 160 using traces or other electrical connections.

Additionally, providing both top and bottom terminals for a vector inductor can reduce an electrical length between the vector inductor's terminals and an innermost conductor in the vector inductor's stack.

Figure 7B:
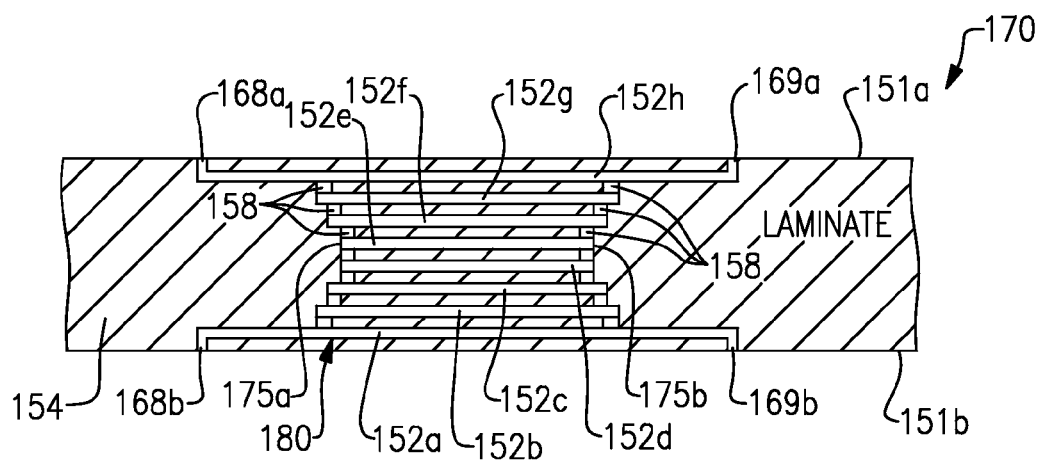
FIG. 7B is a cross section of a laminated substrate according to another embodiment.

FIG. 7B is a cross section of a laminated substrate 170 according to another embodiment.

The laminated substrate 170 of FIG. 7B is similar to the laminated substrate 150 of FIG. 7A, except that the laminated substrate 170 includes a vector inductor 180 that includes a conductor stack with tapered sides 175a, 175b. In particular, rather than including a stack of conductors of substantially the same width, the illustrated configuration includes a stack of conductors that are tapered in width with the uppermost and bottommost conductors having a longer width relative to conductors in the middle of the stack.

Configuring the conductors 152a-152h in this manner can help balance differences in mutual coupling between conductors in the stack and/or to balance a flow of current through the conductors relative to one another. For example, when the conductors are not tapered, the innermost conductor of the stack may have a larger amount of mutual coupling relative to the stack's outermost conductors, and thus the innermost conductor may have a larger overall inductance and smaller current flow relative to the outermost conductors. Thus, the conductors in the stack can be tapered to compensate for differences in mutual coupling between conductors to provide substantially the same amount of current flow in each of the conductors in the vector inductor's stack. In certain embodiments, tapering is also used to compensate for differences in electrical length between the vector inductor's terminals and a particular conductor in the stack.

Accordingly, the illustrated configuration includes conductors that are tapered to balance a flow of current through the conductors relative to one another.

Figure 8A:
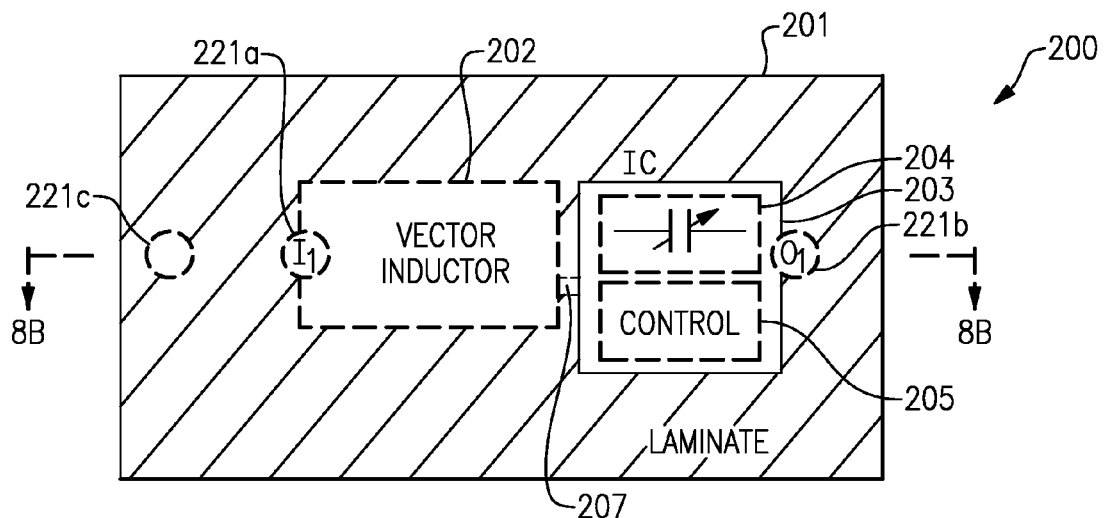
FIG. 8A is a plan view of a tunable filter according to one embodiment.
Figure 8B:
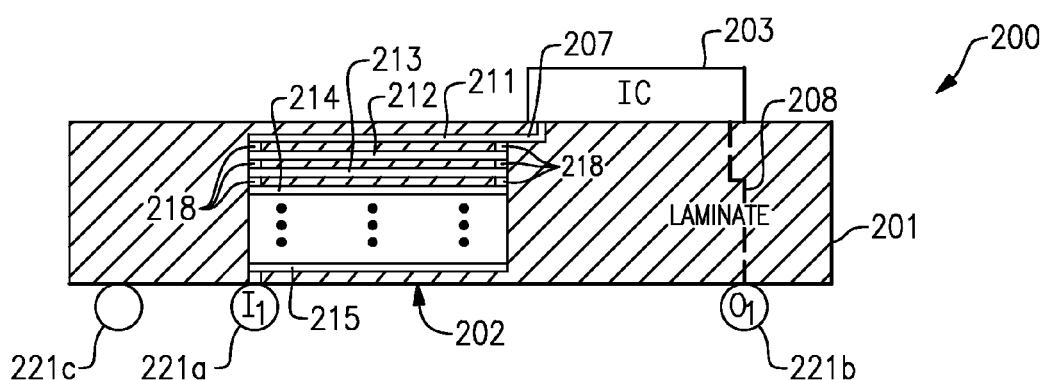
FIG. 8B is a cross-section of the tunable filter of FIG. 8A taken along the lines 8B-8B.
Figure 8C:
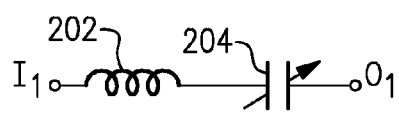
FIG. 8C is a circuit diagram of the tunable filter of FIG. 8A.

FIG. 8A is a plan view of a tunable filter 200 according to one embodiment. FIG. 8B is a cross-section of the tunable filter 200 of FIG. 8A taken along the lines 8B-8B. FIG. 8C is a circuit diagram of the tunable filter 200 of FIG. 8A.

The tunable filter 200 includes a laminated substrate 201 including a vector inductor 202 formed therein. The tunable filter 200 further includes a semiconductor die or integrated circuit (IC) 203 attached to the laminated substrate 201. The tunable filter 200 further includes conductive balls 221a-221c, which can be used to provide electrical connections from the laminated substrate 201 to other components of an RF system. For example, in certain configurations, the tunable filter 200 is implemented as a multi-chip module (MCM), and the conductive balls 221a-221c can provide electrical connections to a phone board.

For clarity of the figures, only certain structures of the tunable filter 200 have been shown. However, persons having ordinary skill in the art will appreciate that the tunable filter 200 can include additional circuitry and/or structures. For example, the tunable filter 200 can include surface mount components, additional ICs, additional conductors and vias, input and/or output impedance matching networks, additional tunable resonators, and/or additional conductive balls or other structures for providing external electrical connections. Such details have been omitted from the figures for clarity.

Electrical connections between the IC 203 and the laminated substrate 201 can be made in a variety of ways. For example, in certain configurations, the IC 203 can be attached to the laminated substrate 201 in a flip-chip configuration in which the IC 203 is bumped to the laminated substrate 201. Thus, the IC 203 can be electrically connected to the laminated substrate 201 using bumps, pillars, and/or bars in certain implementations. However, other configurations are possible, such as implementations in which electrical connections are provided between the IC 203 and the laminated substrate 201 using wire bonds.

The illustrated vector inductor 202 includes a stack of conductors including a first conductor 211, a second conductor 212, a third conductor 213, a fourth conductor 214, and a fifth conductor 215 arranged on different conductive layers of the laminated substrate 201. Additionally, vias 218 have been used to electrically connect the stack of conductors along a first side and along a second side opposite the first side. Although FIG. 8B illustrates the vector inductor 202 as including five conductors in the stack, the vector inductor 202 can include more or fewer conductors in the stack. Additionally, although FIG. 8B illustrates the vector inductor 202 as being implemented using inner-conductors of the laminated substrate 201, the teachings herein are applicable to configurations in which a vector inductor is implemented in part using a top surface conductor and/or a bottom surface conductor of a laminated substrate.

The IC 202 includes a variable capacitor 204 and a control circuit 205. The control circuit 205 can be used to control a capacitor of the variable capacitor 205. In certain embodiments, the variable capacitor 204 is implemented using a variable capacitor array and the control circuit 205 is implemented using a bias voltage generation circuit. Examples of variable capacitor arrays and bias voltage generation circuits will be described in detail further below with reference to FIGS. 12-15B.

In the illustrated configuration, the variable capacitor 204 and the vector inductor 202 are electrically in series with one another to operate as a series resonator. As shown in FIGS. 8A-8C, a first terminal of the vector inductor 202 located on a first side of the laminated substrate 201 is electrically connected to the first conductive ball 221a, which serves as a first RF input $I_1$. Additionally, a second terminal of the vector inductor 202 located on a second side of the laminated substrate 202 is electrically connected to a first end of the variable capacitor 204 using the conductor 207. Additionally, a second end of the variable capacitor 204 is electrically connected to the second conductive ball 221b, which serves as a first RF output $O_1$. The electrical connection between the second end of the variable capacitor 204 and the second conductive ball 221b can be provided by an electrical path 208 through the laminated substrate 201, which is schematically depicted by a dashed line in FIG. 8B for clarity of the figures.

The illustrated embodiment uses the first conductive ball 221a as an RF input and the second conductive ball 221b as an RF output of the series resonator. In another embodiment, the first conductive ball 221a serves as an RF output and the second conductive ball 221b serves as an RF input.

Additional details of the tunable filter 200 can be similar to those described earlier.

Figure 9A:
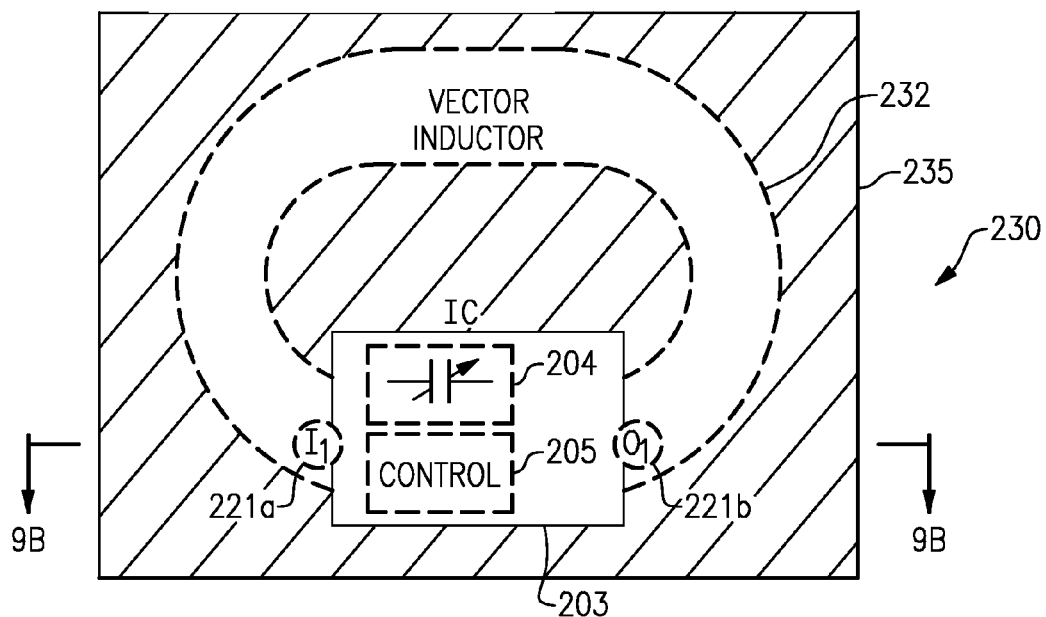
FIG. 9A is a plan view of a tunable filter according to another embodiment.
Figure 9B:
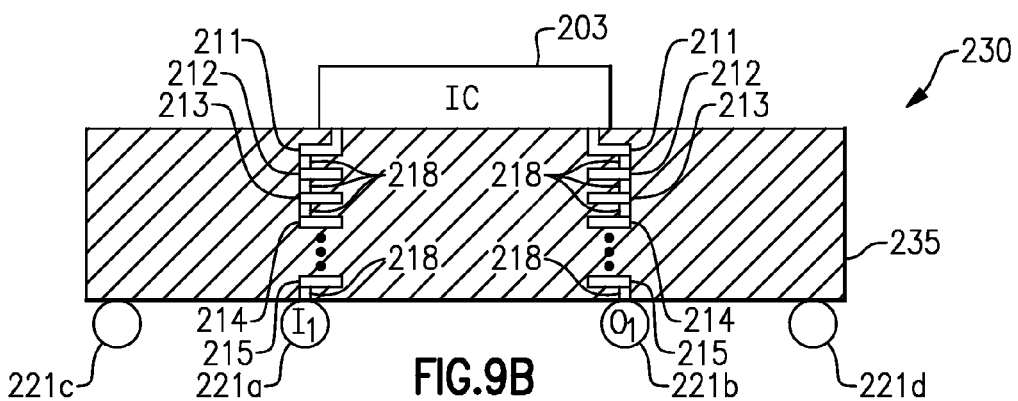
FIG. 9B is a cross-section of the tunable filter of FIG. 9A taken along the lines 9B-9B.
Figure 9C:
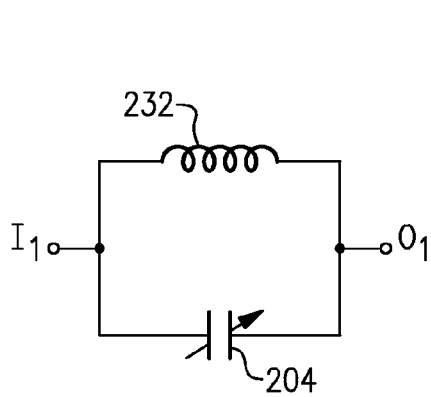
FIG. 9C is a circuit diagram of the tunable filter of FIG. 9A.

FIG. 9A is a plan view of a tunable filter 230 according to another embodiment. FIG. 9B is a cross-section of the tunable filter 230 of FIG. 9A taken along the lines 9B-9B. FIG. 9C is a circuit diagram of the tunable filter 230 of FIG. 9A.

The tunable filter 230 includes a laminated substrate 235 including a vector inductor 232 formed therein. The tunable filter 230 further includes the semiconductor die 203, which is attached to laminated substrate 235. The tunable filter 230 further includes conductive balls 221a-221d. As persons having ordinary skill in the art will appreciate, the tunable filter 230 can include additional circuitry and/or structures not shown.

In the illustrated configuration, the variable capacitor 204 and the vector inductor 232 are electrically in parallel with one another to operate as a parallel resonator.

The vector inductor 232 of FIGS. 9A-9B is similar to the vector inductor 202 of FIGS. 8A-8B, except that the vector inductor 232 includes a curved shaped. The curved shape can aid in connecting the vector inductor 232 in parallel with the variable capacitor 204. Additionally, the curved shaped can generate stronger magnetic field concentration and provide higher inductance. Additional details of the vector inductor 232 can be similar to those described earlier.

As shown in FIGS. 9A-9C, a first terminal of the vector inductor 232 is electrically connected to the first conductive ball 221a, which serves as a first RF input Additionally, a second terminal of the vector inductor 232 is electrically connected to the second conductive ball 221b, which serves as a first RF output $O_1$.

Additional details of the tunable filter 230 can be similar to those described earlier.

Figure 9D:
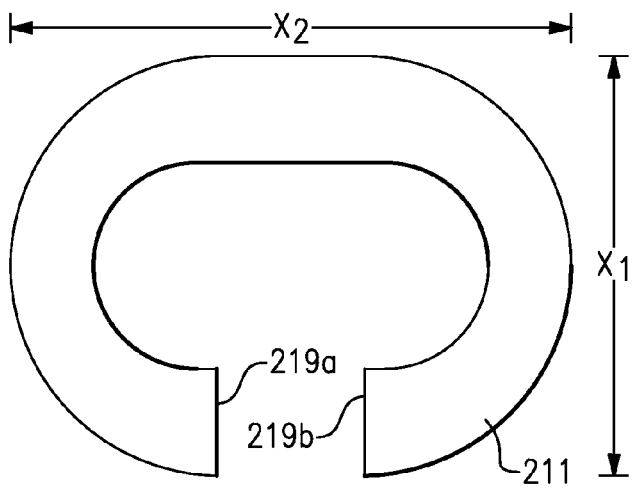
FIG. 9D is a plan view of a conductor of a vector inductor of the tunable filter of FIG. 9A.

FIG. 9D is a plan view of the first conductor 211 of the vector inductor 232. As shown in FIG. 9D, the first conductor 211 includes a first end 219a and a second end 219b opposite the first end. The first conductor 211 has a height $X_1$ and a width $X_2$.

Figure 10A:
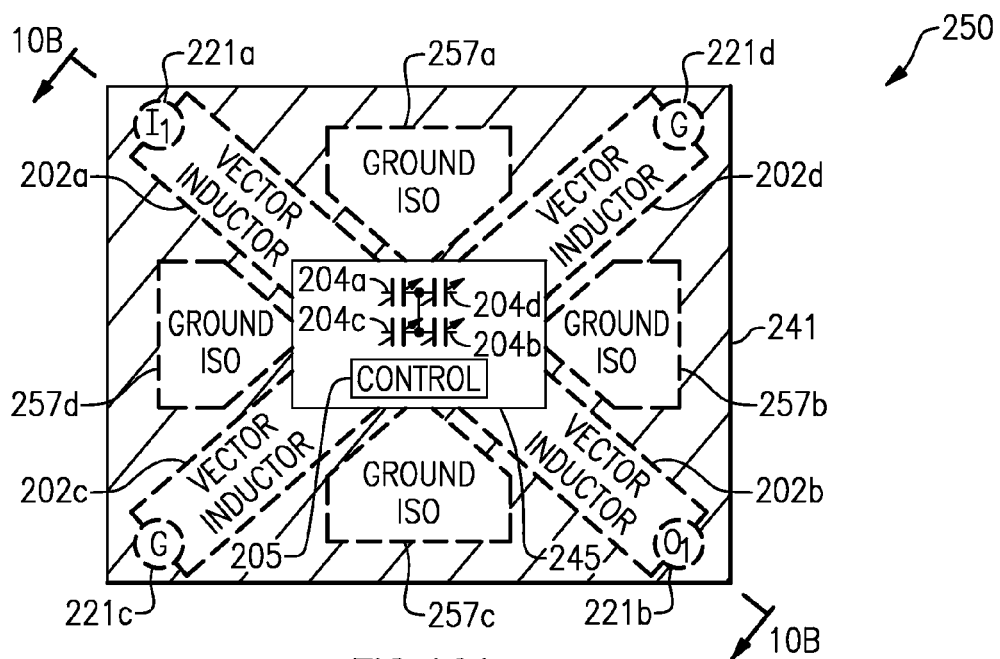
FIG. 10A is a plan view of a tunable filter according to another embodiment.
Figure 10B:
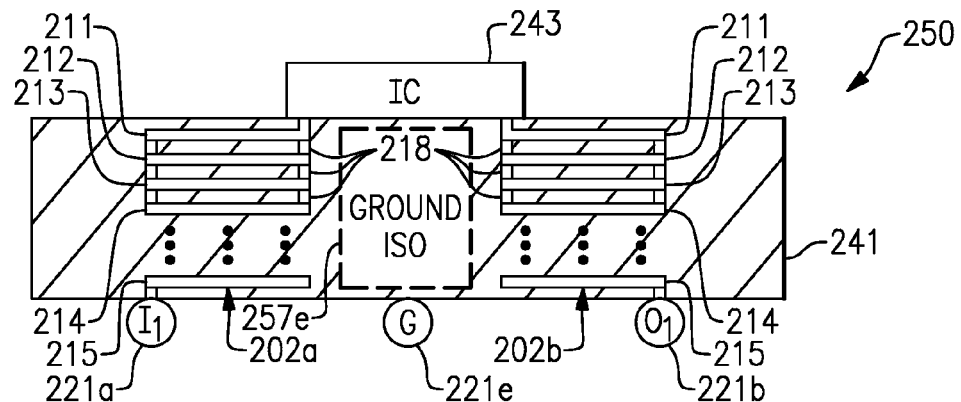
FIG. 10B is a cross-section of the tunable filter of FIG. 10A taken along the lines 10B-10B.
Figure 10C:
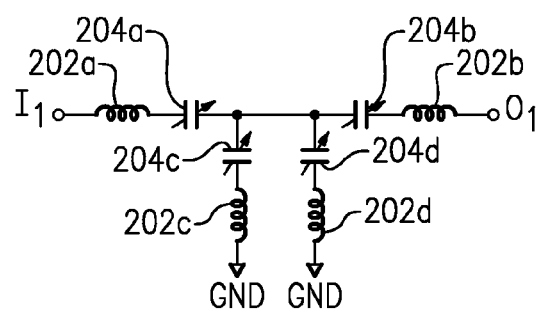
FIG. 10C is a circuit diagram of the tunable filter of FIG. 10A.

FIG. 10A is a plan view of a tunable filter 250 according to another embodiment. FIG. 10B is a cross-section of the tunable filter 250 of FIG. 10A taken along the lines 10B-10B. FIG. 10C is a circuit diagram of the tunable filter 250 of FIG. 10A.

The tunable filter 250 includes a laminated substrate 241 including a first vector inductor 202a, a second vector inductor 202b, a third vector inductor 202c, and a fourth vector inductor 202d formed therein. The vector inductors 202a-202d can have a similar structure as the vector inductor 202 of FIGS. 8A-8C. The tunable filter 250 further includes a semiconductor die 245, which is attached to laminated substrate 241. The semiconductor die 245 includes a control circuit 205, a first variable capacitor 204a, a second variable capacitor 204b, a third variable capacitor 204c, and a fourth variable capacitor 204d. In certain configurations, the variable capacitors 204a-204d are implemented as variable capacitor arrays, and the control circuit 205 is implemented as a bias voltage generation circuit. The tunable filter 250 further includes conductive balls 221a-221e, a first ground isolation structure 257a, a second ground isolation structure 257b, a third ground isolation structure 257c, a fourth ground isolation structure 257d, and a fifth ground isolation structure 257e. As persons having ordinary skill in the art will appreciate, the tunable filter 250 can include additional circuitry and/or structures not shown.

In the illustrated configuration, the first vector inductor 202a and the first variable capacitor 204a are electrically in series with one another between a first RF input $I_1$ and an intermediate node of the tunable filter 250. Additionally, the second variable capacitor 204b and the second vector inductor 202b are electrically in series with one another between the intermediate node and a first RF output $O_1$. Furthermore, the third variable capacitor 204c and the third vector inductor 202c are electrically in series with one another between the intermediate node and ground GND. Additionally, the fourth variable capacitor 204d and the fourth vector inductor 202d are electrically in series with one another between the intermediate node and ground GND. As shown in FIG. 10B, a first terminal of the first vector inductor 202a is electrically connected to the first conductive ball 221a, which serves as the first RF input Additionally, a first terminal of the second vector inductor 202b is electrically connected to the second conductive ball 221b, which serves as the first RF output $O_1$. Furthermore, a first terminal of the third vector inductor 202c is electrically connected to the third conductive ball 221c and a first terminal of the fourth vector inductor 202d is electrically connected to the fourth conductive ball 221d. The third and fourth conductive balls 221c, 221d are electrically connected to ground GND in this configuration.

As shown in FIG. 10A, the first ground isolation structure 257a is positioned between the first and fourth vector inductors 202a, 202d. Additionally, the second ground isolation structure 257b is positioned between the second and fourth vector inductors 202b, 202d. Furthermore, the third ground isolation structure 257c is positioned between the second and third vector inductors 202b, 202c. Additionally, the fourth ground isolation structure 257d is positioned between the first and third vector inductors 202a, 202c. In certain embodiments, the tunable filter 250 further includes the fifth ground isolation structure 257e is positioned beneath the semiconductor die 245.

The ground isolation structures 257a-257e can be implemented using vias and conductors that are electrically connected to ground. For example, a particular ground isolation structure can be electrically connected to a column of vias and conductors that extend through the laminated substrate 241. The ground isolation structures 257a-257e can help prevent magnetic and/or electric fields of the vector inductors 202a-202d from interfering with one another. In certain configurations, the ground isolation structures 257a-257e can be electrically connected to ground GND using conductive balls. For example, in the illustrated configuration, the fifth ground isolation structure 257e is electrically connected to ground GND using the fifth conductive ball 221e.

Additional details of the tunable filter 250 can be similar to those described earlier.

Figure 11A:
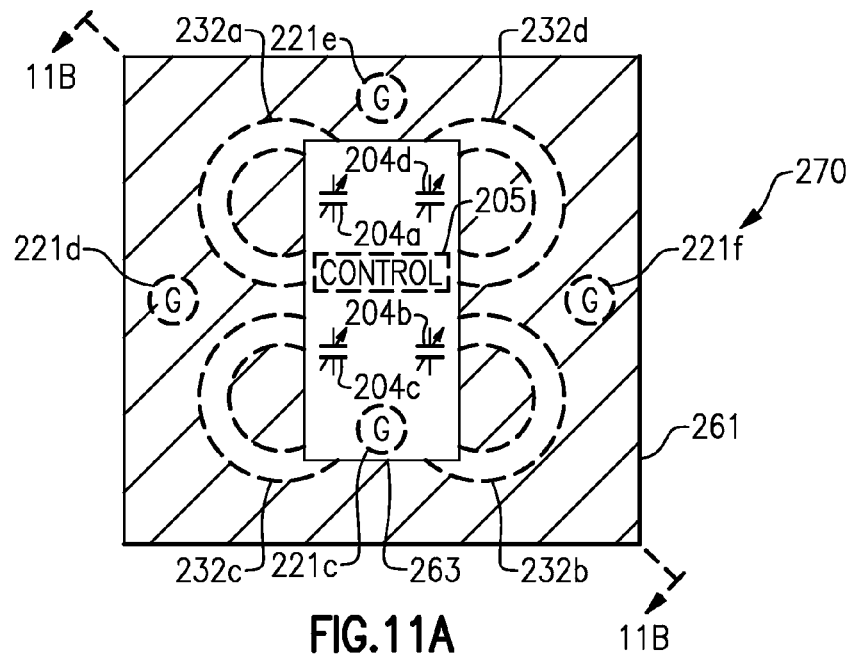
FIG. 11A is a plan view of a tunable filter according to another embodiment.
Figure 11B:
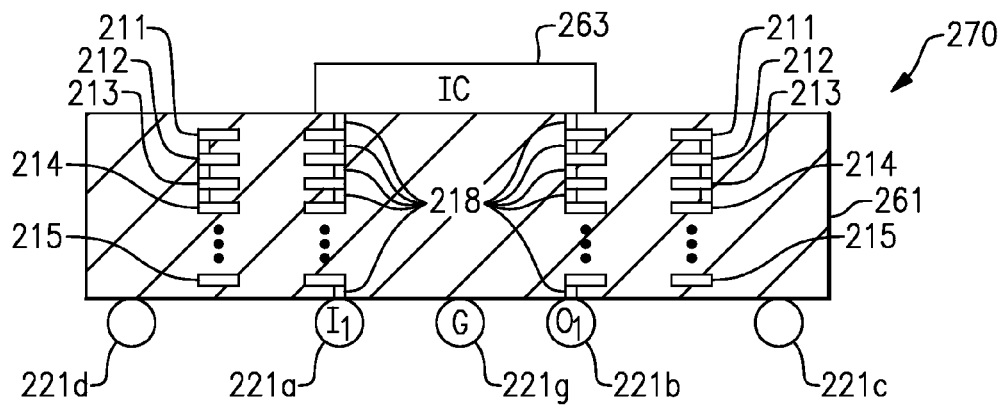
FIG. 11B is a cross-section of the tunable filter of FIG. 11A taken along the lines 11B-11B.
Figure 11C:
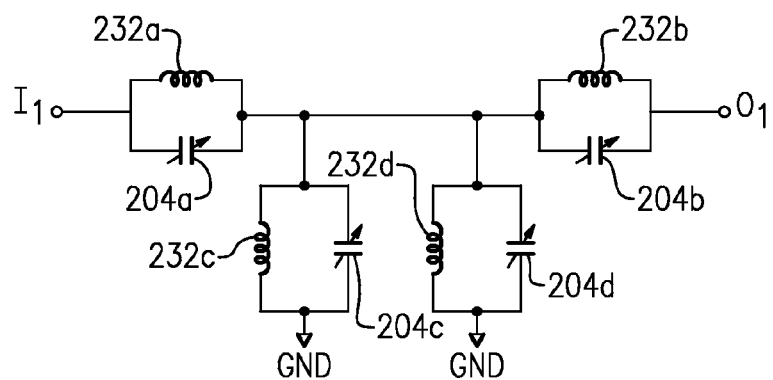
FIG. 11C is a circuit diagram of the tunable filter of FIG. 11A.

FIG. 11A is a plan view of a tunable filter 270 according to another embodiment. FIG. 11B is a cross-section of the tunable filter 270 of FIG. 11A taken along the lines 11B-11B. FIG. 11C is a circuit diagram of the tunable filter 270 of FIG. 11A.

The tunable filter 270 includes a laminated substrate 261 including a first vector inductor 232a, a second vector inductor 232b, a third vector inductor 232c, and a fourth vector inductor 232d formed therein. The tunable filter 270 further includes a semiconductor die 263, which is attached to laminated substrate 261. The semiconductor die 263 includes the control circuit 205 and first to fourth variable capacitors 204a-204d. In certain configurations, the variable capacitors 204a-204d are implemented as variable capacitor arrays, and the control circuit 205 is implemented as a bias voltage generation circuit. The tunable filter 270 further includes conductive balls 221a-221g. As persons having ordinary skill in the art will appreciate, the tunable filter 270 can include additional circuitry and/or structures not shown.

In the illustrated configuration, the first vector inductor 232a and the first variable capacitor 204a are electrically in parallel with one another between a first RF input $I_1$ and an intermediate node of the tunable filter 270. Additionally, the second variable capacitor 204b and the second vector inductor 232b are electrically in parallel with one another between the intermediate node and a first RF output $O_1$. Furthermore, the third variable capacitor 204c and the third vector inductor 232c are electrically in parallel with one another between the intermediate node and ground GND. Additionally, the fourth variable capacitor 204d and the fourth vector inductor 232d are electrically in parallel with one another between the intermediate node and ground GND. As shown in FIG. 11B, a first terminal of the first vector inductor 232a is electrically connected to the first conductive ball 221a, which serves as the first RF input $I_1$. Additionally, a first terminal of the second vector inductor 232b is electrically connected to the second conductive ball 221b, which serves as the first RF output $O_1$.

As shown in FIG. 11A, the conductive balls 221c-221f can be positioned between the vector inductors 232a-232d. In certain configurations, the conductive balls 221c-221f are electrically connected to ground isolation structures used to isolate the vector inductors 232a-232d from one another in a manner similar to that described earlier. In certain embodiments, a ground isolation structure can also be positioned beneath the semiconductor die 263 and electrically connected to ground GND using the conductive ball 221g.

Additional details of the tunable filter 270 can be similar to those described earlier.

Figure 12:
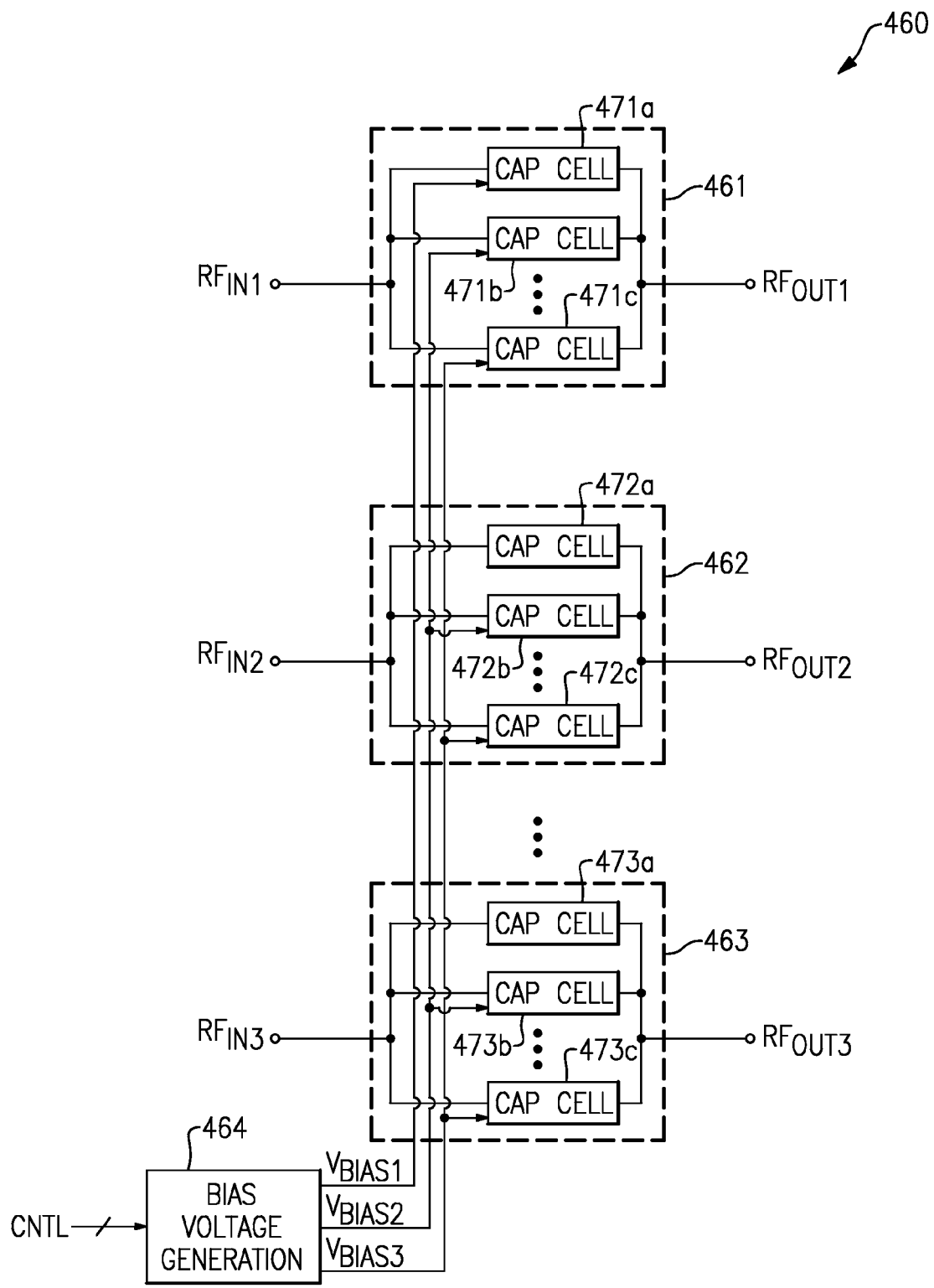
FIG. 12 is a schematic diagram of an integrated circuit (IC) according to one embodiment.

FIG. 12 is a schematic diagram of an integrated circuit (IC) or semiconductor die 460 according to one embodiment. The IC 460 includes a first variable capacitor array 461, a second variable capacitor array 462, a third variable capacitor array 463, and a bias voltage generation circuit 464. The IC 460 includes a first RF input $RF_{IN1}$, a second RF input $RF_{IN2}$, a third RF input $RF_{IN3}$, a first RF output $RF_{OUT1}$, a second RF output $RF_{OUT2}$, and a third RF output $RF_{OUT3}$.

The first variable capacitor array 461 includes a first variable capacitor cell 471a, a second variable capacitor cell 471b, and a third variable capacitor cell 471c. The first to third capacitors cells 471a-471c are electrically connected in parallel between the first RF input $RF_{IN1}$ and the first RF output $RF_{OUT1}$. The second variable capacitor array 462 includes a first variable capacitor cell 472a, a second variable capacitor cell 472b, and a third variable capacitor cell 472c. The first to third capacitors cells 472a-472c are electrically connected in parallel between the second RF input $RF_{IN2}$ and the second RF output $RF_{OUT2}$. The third variable capacitor array 463 includes a first variable capacitor cell 473a, a second variable capacitor cell 473b, and a third variable capacitor cell 473c. The first to third capacitors cells 473a-473c are electrically connected in parallel between the third RF input $RF_{IN3}$ and the third RF output $RF_{OUT3}$.

Although FIG. 12 illustrates the IC 460 as including three variable capacitor arrays, the IC 460 can be adapted to include more or fewer variable capacitor arrays. In other embodiments, the IC 460 can include between about 1 and about 16 variable capacitor arrays. However, other configurations are possible.

Additionally, although FIG. 12 illustrates each variable capacitor array as including three variable capacitor cells, the variable capacitor arrays can be adapted to include more or fewer variable capacitor cells. In one embodiment the IC 460 includes between about 6 and about 12 variable capacitor cells. However, a variable capacitor array can be adapted to include other numbers of variable capacitor cells.

The bias voltage generation circuit 464 receives the control signal CNTL, and generates a first bias voltage $V_{BIAS1}$, a second bias voltage $V_{BIAS2}$, and a third bias voltage $V_{BIAS3}$. As shown in FIG. 12, the first bias voltage $V_{BIAS1}$ is provided to the first variable capacitor cell 471a of the first variable capacitor array 461, to the first variable capacitor cell 472a of the second variable capacitor array 462, and to the first variable capacitor cell 473a of the third variable capacitor array 463. Additionally, the second bias voltage $V_{BIAS2}$ is provided to the second variable capacitor cell 471b of the first variable capacitor array 461, to the second variable capacitor cell 472b of the second variable capacitor array 462, and to the second variable capacitor cell 473b of the third variable capacitor array 463. Furthermore, the third bias voltage $V_{BIAS3}$ is provided to the third variable capacitor cell 471c of the first variable capacitor array 461, to the third variable capacitor cell 472c of the second variable capacitor array 462, and to the third variable capacitor cell 473c of the third variable capacitor array 463.

The bias voltage generation circuit 464 can be used to control the voltage levels of the first, second, and third bias voltages $V_{BIAS1}$-$V_{BIAS3}$ to control the capacitances of the first to third variable capacitor arrays 461-463.

In one embodiment, the illustrated variable capacitor cells are implemented using MOS capacitors. Additionally, the first to third bias voltages $V_{BIAS1}$-$V_{BIAS3}$ can be used to bias the MOS capacitors at two or more bias voltages associated with a small amount of capacitance variation, and thus with high linearity. For example, in one embodiment, the first to third bias voltages $V_{BIAS1}$-$V_{BIAS3}$ can be controlled to bias the MOS capacitors in accumulation or inversion to control the overall capacitance of the arrays.

In certain configurations, the MOS capacitors can be fabricated using silicon on insulator (SOI) processes. However, other configurations are possible, including, for example, implementations in which the MOS capacitors are fabricated using deep sub-micron (DSM) complementary metal oxide semiconductor (CMOS) processes.

In certain configurations herein, a variable capacitor cell can include one or more pairs of MOS capacitors implemented using anti-parallel and/or anti-series configurations. Configuring a variable capacitor cell in this manner can help reduce a variation in the cell's capacitance in the presence of RF signals.

As shown in FIG. 12, the bias voltage generation circuit 464 receives the control signal CNTL, which can be used to select the voltage levels of the first, second, and third bias voltages $V_{BIAS1}$-$V_{BIAS3}$. In certain configurations, each of the variable capacitor arrays 461-463 includes weighted banks of capacitors cells. For example, in one embodiment, the first variable capacitor cell 471a, the second variable capacitor cell 471b, and the third variable capacitor cell 471c have different capacitance weights or sizes. For example, the variable capacitor cells of a particular variable capacitor array can increase in size by a scaling factor, such as 2. Thus, an overall capacitance of a particular variable capacitor array can be based on a sum of the capacitances of the array's MOS variable capacitor cells.

The IC 460 includes a first signal path from the first RF input $RF_{IN1}$ to the first RF output $RF_{OUT1}$ through the first variable capacitor array 461. Additionally, the IC 460 includes a second signal path from the second RF input $RF_{IN2}$ to the second RF output $RF_{OUT2}$ through the second variable capacitor array 462, and a third signal path from the third RF input $RF_{IN3}$ to the third RF output $RF_{OUT3}$ through the third variable capacitor array 463.

In certain embodiments, the IC 460 does not include any switches in the signal paths between the IC's inputs and outputs through the variable capacitor arrays. By configuring the variable capacitor arrays in this manner, the variable capacitor arrays can have lower insertion loss and/or higher linearity relative to a configuration in which capacitance is provided by selecting discrete capacitors via switches.

As shown in FIG. 12, multiple variable capacitor arrays can be fabricated on a common IC, and can share control signals but receive different RF signals. However, other configurations are possible, such as implementations in which the variable capacitor arrays receive separate control signals.

Figure 13A:
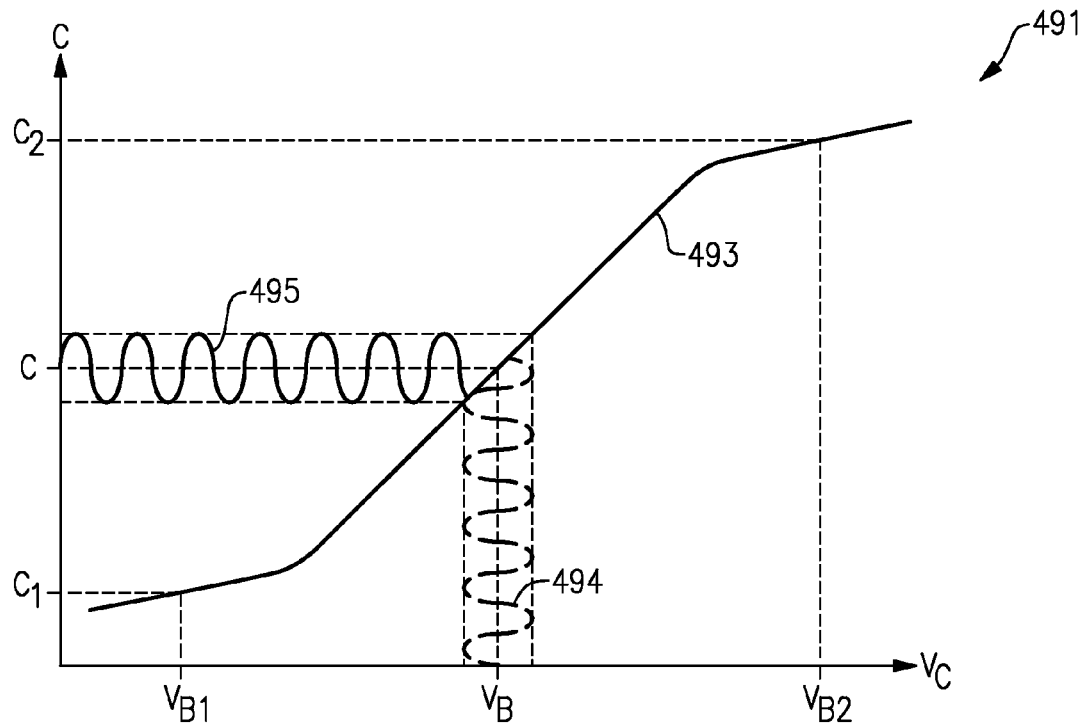
FIGS. 13A and 13B are graphs of two examples of capacitance versus bias voltage.
Figure 13B:
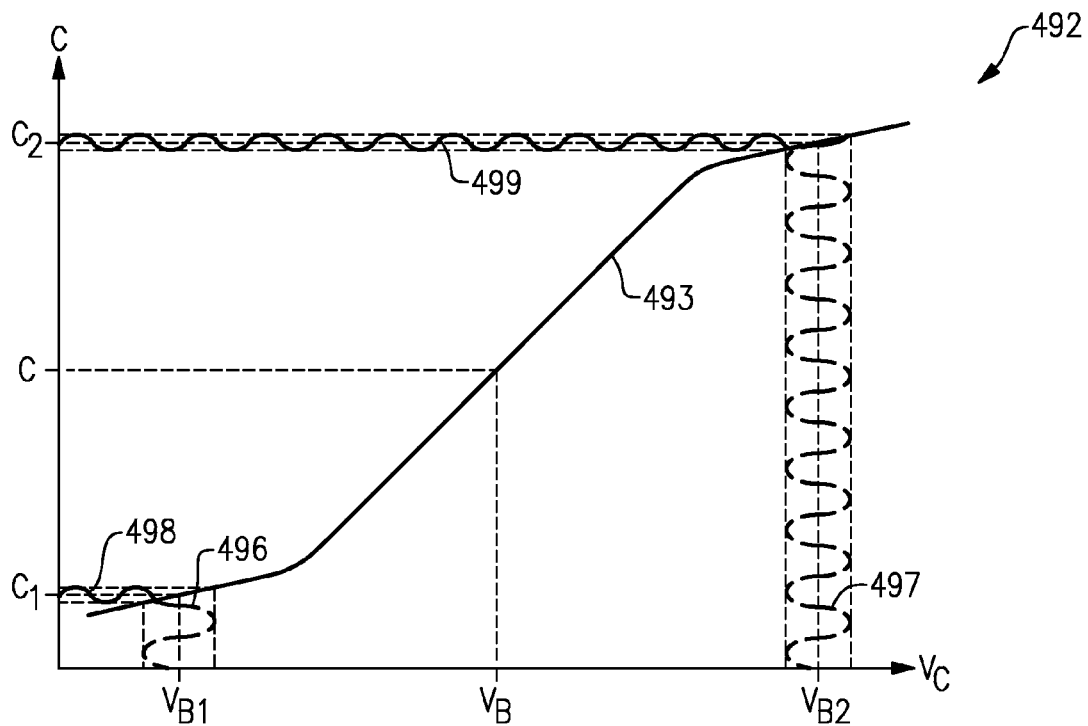

FIGS. 13A and 13B are graphs of two examples of capacitance versus bias voltage. FIG. 13A includes a first graph 491 of capacitance versus voltage, and FIG. 13B includes a second graph 492 of capacitance versus voltage.

The first graph 491 includes a high frequency capacitance-voltage (CV) plot 493 for one example of an n-type MOS capacitor. As shown in the CV plot 493, the capacitance of the MOS capacitor can increase with bias voltage level. The increase in capacitance can be associated with the MOS capacitor transitioning between operating regions or modes. For example, at low bias voltage levels, the MOS capacitor can operate in an accumulation mode in which a majority carrier concentration near the gate dielectric/semiconductor interface is greater than a background majority carrier concentration of the semiconductor. Additionally, as the voltage level of the bias voltage increases, the MOS capacitor can transition from the accumulation mode to a depletion mode in which minority and majority carrier concentrations near the gate dielectric/semiconductor interface are less than the background majority carrier concentration. Furthermore, as the voltage level of the bias voltage further increases, the MOS capacitor can transition from the depletion mode to an inversion mode in which the minority carrier concentration near the gate dielectric/semiconductor interface is greater than the background majority carrier concentration.

The first graph 491 has been annotated to include an AC signal component 494 when biasing the MOS capacitor at a bias voltage level $V_B$. When the AC signal component 494 is not present, the MOS capacitor can have a capacitance C. However, as shown by in FIG. 13A, the AC signal component 494 can generate a capacitance variation 495. The capacitance variation 495 can be associated with a capacitance variation generated by the AC signal component 494.

With reference to FIG. 5B, the second graph 492 includes the CV plot 493, which can be as described above. The second graph 492 has been annotated to include a first AC signal component 496 associated with biasing the MOS capacitor at a first bias voltage level $V_{B1}$, and a second AC signal component 497 associated with biasing the MOS capacitor at a second bias voltage level $V_{B2}$.

As shown in FIG. 13B, the first AC signal component 496 can generate a first capacitance variation 498, and the second AC signal component 497 can generate a second capacitance variation 499.

When biased at the first bias voltage level $V_{B1}$ or the second bias voltage level $V_{B2}$, the MOS capacitor can nevertheless have a capacitance that varies in the presence of AC signals. However, the first and second bias voltage levels $V_{B1}$, $V_{B2}$ can be associated with DC bias points of the MOS capacitor having relatively small capacitance variation or change.

Accordingly, in contrast to the capacitance variation 495 of FIG. 13A which has a relatively large magnitude, the first and second capacitance variations 498, 499 of FIG. 13B have a relatively small magnitude.

In certain embodiments herein, a variable capacitor array includes MOS capacitors that are biased at bias voltages associated with small capacitance variation. By biasing the MOS capacitors in this manner, a variable capacitor array can exhibit high linearity.

Such a variable capacitor array can also have less capacitance variation when operated in a system using multiple frequency bands. For example, when included in a tunable filter, the variable capacitor array can provide relatively constant capacitance even when tuned to frequency carriers or bands that are separated by a wide frequency.

In certain embodiments, the first bias voltage level $V_{B1}$ is selected to operate in the MOS capacitor in an accumulation mode, and the second bias voltage level $V_{B2}$ is selected to operate the MOS capacitor in an inversion mode. In certain configurations, biasing a MOS capacitor in this manner can achieve a capacitance tuning range of 3:1 or more. However, other tuning ranges can be realized, including, for example, a tuning range associated with a particular manufacturing process used to fabricate the MOS capacitor.

Figure 14A:
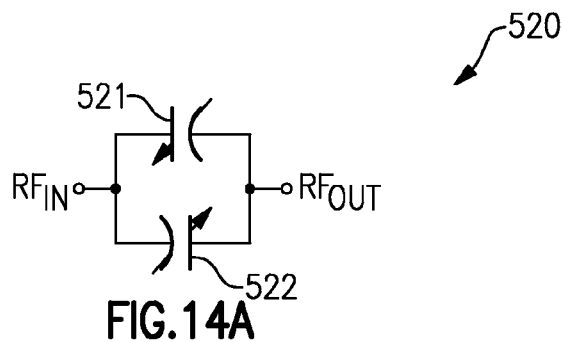
FIG. 14A is a schematic diagram of a variable capacitor cell according to one embodiment.

FIG. 14A is a schematic diagram of a variable capacitor cell 520 according to one embodiment. The variable capacitor cell 520 includes a first variable capacitor 521 and a second variable capacitor 522. The variable capacitor cell 520 further includes an RF input $RF_{IN}$ and an RF output $RF_{OUT}$.

The first variable capacitor 521 includes an anode electrically connected to the RF input $RF_{IN}$ and a cathode electrically connected to the RF output $RF_{OUT}$. The second variable capacitor 522 includes an anode electrically connected to the RF output $RF_{OUT}$ and a cathode electrically connected to the RF input $RF_{IN}$.

In the illustrated configuration, an anode structure of the first and second variable capacitors 521, 522 is different than a cathode structure of the first and second variable capacitors 521, 522. For example, the first and second variable capacitors 521, 522 can be implemented by first and second MOS capacitors, respectively. Additionally, the first and second MOS capacitors can have anodes associated with transistor gates and cathodes associated with transistor source and/or drain regions.

The first and second variable capacitors 521, 522 have been implemented in an anti-parallel or inverse parallel configuration. Electrically connecting the first and second variable capacitors 521, 522 in this manner can enhance the robustness of the capacitors to capacitance variation in the presence of RF signals. For example, when the first and second variable capacitors are each biased with a particular bias voltage, the variable capacitors' capacitance may change when an RF input signal is received on the RF input $RF_{IN}$. However, a capacitance variation $\Delta C$ of the first and second variable capacitors 521, 522 can have about equal magnitude, but opposite polarity. For instance, in the presence of an RF input signal that generates a capacitance variation having a magnitude $\Delta C$, the first variable capacitor 521 may have a capacitance $C_V + \Delta C$, while the second variable capacitor 522 may have a capacitance $C_V - \Delta C$. Since the first and second variable capacitors 521, 522 are electrically connected in parallel with one another, an overall capacitance of the first and second variable capacitors 521, 522 can be about equal to $2*C_V$.

Accordingly, the illustrated configuration can provide reduced capacitance variation in the presence of RF signals. Furthermore, the illustrated variable capacitor cell 520 can exhibit high linearity.

Figure 14B:
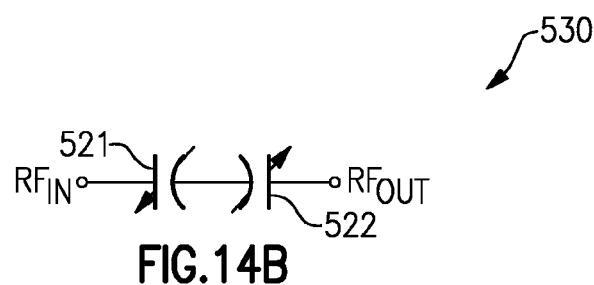
FIG. 14B is a schematic diagram of a variable capacitor cell according to another embodiment.

FIG. 14B is a schematic diagram of a variable capacitor cell 530 according to another embodiment. The variable capacitor cell 530 includes the first and second variable capacitors 521, 522.

The variable capacitor cell 530 of FIG. 14B is similar to the variable capacitor cell 520 of FIG. 14A, except that the variable capacitor cell 530 includes a different arrangement of the first and second variable capacitors 521, 522. In particular, in contrast to the variable capacitor cell 520 of FIG. 14A which implements the first and second variable capacitors 521, 522 in an anti-parallel configuration, the variable capacitor cell 530 of FIG. 14B implements the first and second variable capacitors 521, 522 in an anti-series or inverse series configuration.

For example, the first variable capacitor 521 includes an anode electrically connected to the RF input $RF_{IN}$, and a cathode electrically connected to a cathode of the second variable capacitor 522. Additionally, the second variable capacitor 522 further includes an anode electrically connected to first and second variable capacitors 521, 522.

Configuring the variable capacitor cell 530 in this manner can reduce variation of the cell's capacitance in the presence of an RF input signal at the RF input $RF_{IN}$.

Although the variable capacitor cell 530 of FIG. 14B can have a smaller capacitance relative to the variable capacitor cell 520 of FIG. 14A for a given bias voltage level, the variable capacitor cell 530 of FIG. 14B can have a higher voltage handling capability relative to the variable capacitor cell 520 of FIG. 14A.

The variable capacitor cell 530 of FIG. 14B shows an anti-series configuration in which the cathodes of the first and second variable capacitors 521, 522 electrically connected to one another and the anodes of the first and second variable capacitors 521, 522 are electrically connected to the RF input $RF_{IN}$ and the RF output $RF_{OUT}$, respectively. However, the teachings herein are also applicable to anti-series configurations in which the anodes of the first and second variable capacitors 521, 522 are electrically connected to one another and the cathodes of the first and second variable capacitors 521, 522 are electrically connected to the RF input $RF_{IN}$ and the RF output $RF_{OUT}$, respectively.

For example, such a configuration can be more robust against damage from electrostatic discharge (ESD) events. For instance, the anodes of the first and second variable capacitors 521, 522 can be associated with gates of MOS capacitors and the cathodes of the first and second variable capacitors 521, 522 can be associated with source and/or drain regions of MOS capacitors. Since, a MOS capacitor's source and drain regions typically can withstand a greater voltage relative to the MOS capacitor's gate region, an anti-series variable capacitor cell with cathodes electrically connected to input and output pins may exhibit a greater robustness to ESD events or other overvoltage conditions relative to an anti-series variable capacitor cell with anodes electrically connected to input and output pins.

Figure 15A:
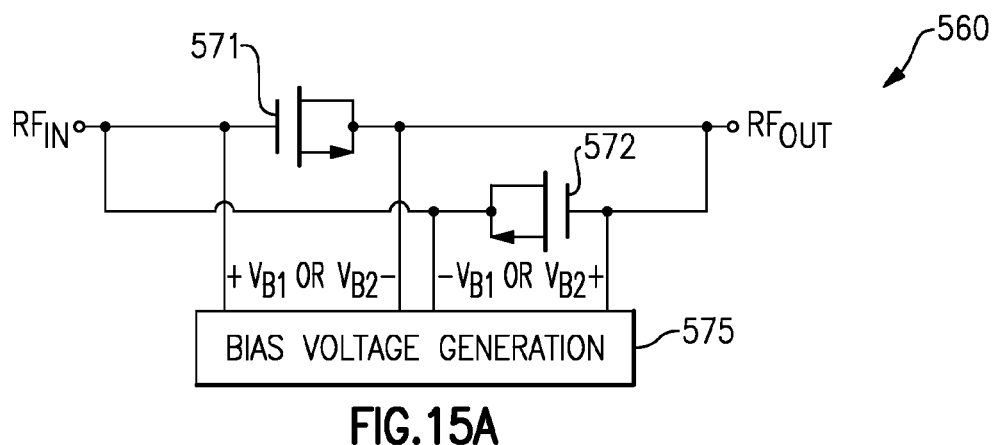
FIG. 15A is a schematic diagram of a metal oxide semiconductor (MOS) variable capacitor cell according to one embodiment.

FIG. 15A is a schematic diagram of a metal oxide semiconductor (MOS) variable capacitor cell 560 according to one embodiment. The MOS variable capacitor cell 560 includes a first MOS capacitor 571 and a second MOS capacitor 572. The MOS variable capacitor cell 560 further includes an RF input $RF_{IN}$ and an RF output $RF_{OUT}$.

Electrical connections between the MOS variable capacitor cell 560 and a bias voltage generation circuit 575 have been illustrated in FIG. 8A. Although not illustrated in FIG. 8A, the bias voltage generation circuit 575 can be used to bias additional MOS variable capacitor cells.

The RF input $RF_{IN}$ is electrically connected to a gate of the first MOS capacitor 571 and to a source and drain of the second MOS capacitor 572. Additionally, the RF output $RF_{OUT}$ is electrically connected to a gate of the second MOS capacitor 572 and to a source and drain of the first MOS capacitor 571.

As shown in FIG. 15A, the bias voltage generation circuit 575 can be used to bias the first and second MOS capacitors 571, 572 at a first bias voltage level $V_{B1}$ or at a second bias voltage level $V_{B2}$. In one embodiment, the first and second MOS capacitors 571, 572 operate in accumulation when biased at the first bias voltage level $V_{B1}$ and operate in inversion when biased at the second bias voltage level $V_{B2}$.

Biasing the first and second MOS capacitors 571, 572 in this manner can improve linearity relative to a configuration in which the first and second MOS capacitors 571, 572 are biased at a bias voltage level selected from a continuous tuning voltage range. For example, a MOS capacitor can exhibit a change in capacitance in response to changes in an applied RF signal, and a magnitude of the capacitance change can vary with the MOS capacitor's bias voltage level.

Figure 15B:
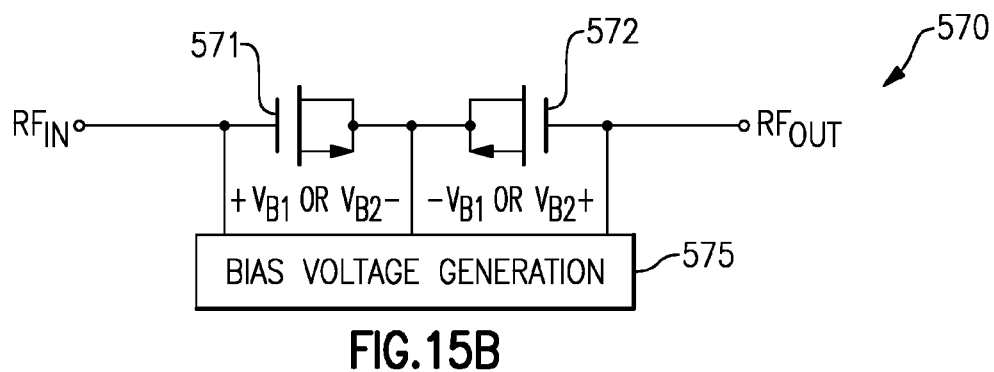
FIG. 15B is a schematic diagram of a MOS variable capacitor cell according to another embodiment.

FIG. 15B is a schematic diagram of a MOS variable capacitor cell 570 according to another embodiment. The MOS variable capacitor cell 570 includes first and second MOS capacitors 571, 572. Electrical connections between the MOS variable capacitor cell 570 and the bias voltage generation circuit 575 have been illustrated in FIG. 15B.

The MOS variable capacitor cell 570 of FIG. 15B is similar to the MOS variable capacitor cell 560 of FIG. 15A, except that the MOS variable capacitor cell 570 of FIG. 15B implements the first and second MOS capacitors 571, 572 in an anti-series configuration, rather than in an anti-parallel configuration.

For example, in the illustrated configuration, the gate of the first MOS capacitor 571 is electrically connected to the RF input $RF_{IN}$, and the gate of the second MOS capacitor 572 is electrically connected to the RF output $RF_{OUT}$. Additionally, the source and drain of the first MOS capacitor 571 are electrically connected to the source and drain of the second MOS capacitor 572. As shown in FIG. 15B, the bias voltage generation circuit 575 can be used to bias the first and second MOS capacitors 571, 572 at the first bias voltage level $V_{BA}$ or at the second bias voltage level $V_{B2}$.

Although FIG. 15B illustrates an anti-series configuration in which the cathodes of the first and second MOS capacitors are electrically connected to one another, the teachings herein also applicable to anti-series configurations in which the anodes of the first and second MOS capacitors are electrically connected to one another. For example, in another embodiment, the source and drain of the first MOS capacitor 571 are electrically connected to the RF input $RF_{IN}$, and the source and drain of the second MOS capacitor 572 are electrically connected to the RF output $RF_{OUT}$. Additionally, the gate of the first MOS capacitor 571 is electrically connected to the gate of the second MOS capacitor 572.

Figure 16A:
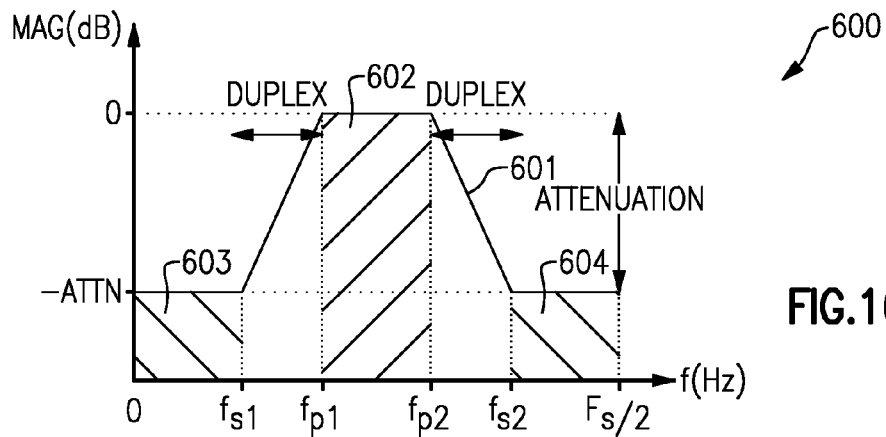
FIG. 16A is a graph of gain versus frequency for one example of a bandpass filter.

FIG. 16A is a graph 600 of gain versus frequency for one example of a bandpass filter. The graph 600 includes a gain versus frequency plot 601. As shown in FIG. 16A, the bandpass filter can include a first stop band 603, a second stop band 604, and a pass band 602. The graph 600 can represent a gain versus frequency response of a fixed filtering structure, such as a SAW filter.

Figure 16B:
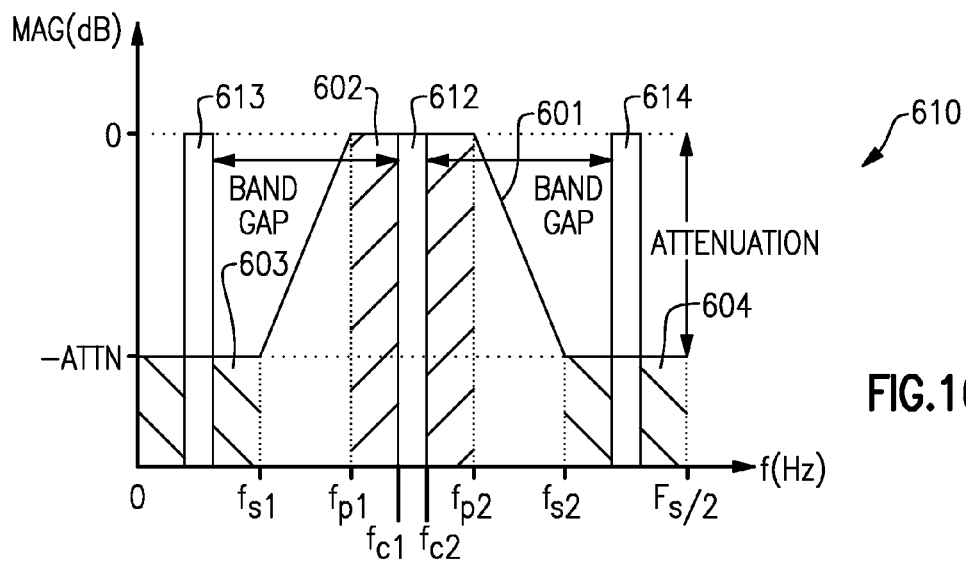
FIG. 16B is a graph of gain versus frequency for one embodiment of a tunable filter.

FIG. 16B is a graph 610 of gain versus frequency for one embodiment of a tunable filter. The graph 610 of FIG. 16B is similar to the graph 600 of FIG. 16A, except that the graph 610 further includes a first tunable resonator gain versus frequency plot 612, a second tunable resonator gain versus frequency plot 613, and a third tunable resonator gain versus frequency plot 614. The capacitance of the tunable resonator can be controlled to tune the resonator's frequency response. The gain versus frequency plots 612-614 of FIG. 16B illustrate various possible gain versus frequency plots associated with different tunings. However, a tunable resonator can be tuned in other ways.

As shown in FIG. 16B, a tunable resonator can be used to tune a filter to a single channel, rather than to a whole pass band 602 suitable for passing a particular frequency band. The tunable resonator can provide lower insertion loss and/or higher frequency selectivity relative to certain fixed bandpass filters, which can have a fixed performance. Additionally, the tunable resonator can operate with more band gap, since the tunable resonator can be tuned to a bandwidth that is smaller than the pass band 602. For instance, in one example of LTE operating with single-mode, the channel bandwidth could be around 3-20 MHz, and thus may be, for instance, a factor of 3 to 5 times smaller than the pass band.

The Q-factor of a tunable resonator can be inversely proportional to bandwidth. Accordingly, a tuned resonator can be tuned to a relatively narrow bandwidth and can operate with high Q-factor. Thus, the tunable resonator's herein can be tuned to narrow bandwidths to operate with high Q-factor and low insertion loss.

Figure 16C:
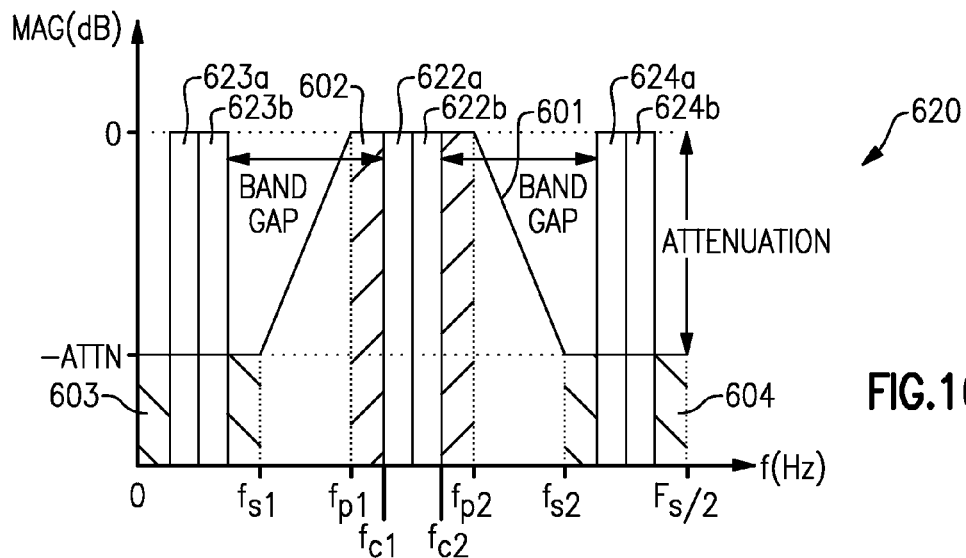
FIG. 16C is a graph of gain versus frequency for another embodiment of a tunable filter.

FIG. 16C is a graph 620 of gain versus frequency for another embodiment of a tunable filter.

The graph 620 of FIG. 16C is similar to the graph 610 of FIG. 16B, except that the graph 620 illustrates a configuration in which a tunable filter has been tuned to two carrier-aggregated channels for higher performance. The graph 620 includes a first tunable resonator gain versus frequency plot associated with a first channel frequency 622a and a second channel frequency 622b. Additionally, the graph 620 includes a second tunable resonator gain versus frequency plot associated with a third channel frequency 623a and fourth channel frequency 623b. Furthermore, the graph 620 includes a third tunable resonator gain versus frequency plot associated with a fifth channel frequency 624a and a sixth channel frequency 624b. The gain versus frequency plots of FIG. 16C illustrate various possible gain versus frequency plots. However, a tunable resonator can be tuned in other ways.

As shown in FIG. 16C, a tunable resonator can be used to tune a filter to two or more carrier-aggregated channels. The illustrated tunable resonator operates with a bandwidth that is less than the pass band 602, rather than to a whole pass band 602 suitable for passing a particular frequency band.

Figure 17A:
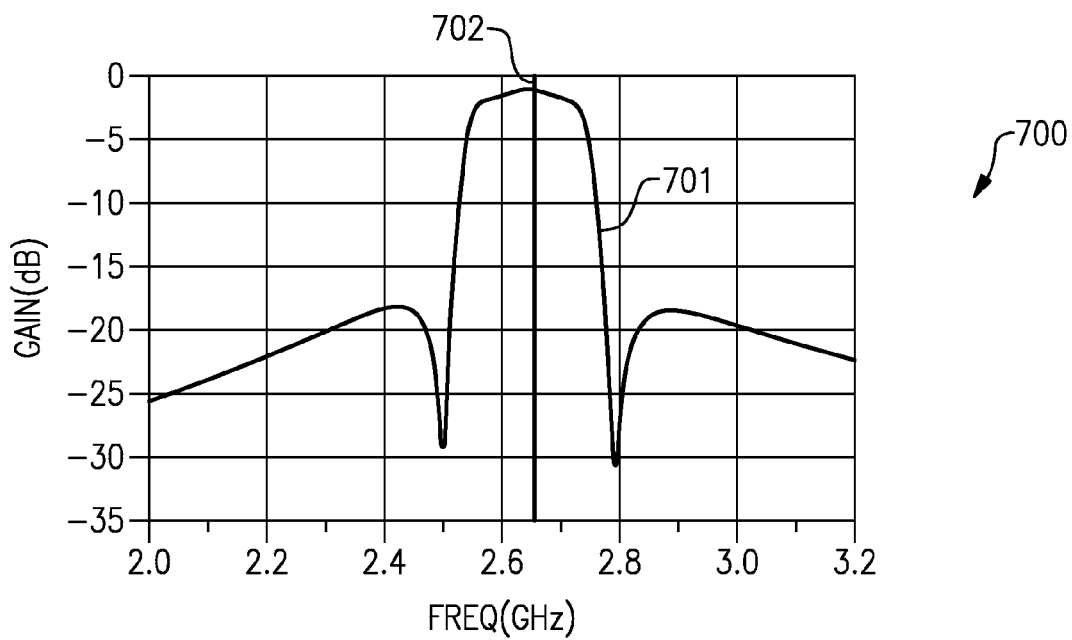
FIG. 17A is a graph of gain versus frequency for another embodiment of a tunable filter.
Figure 17B:
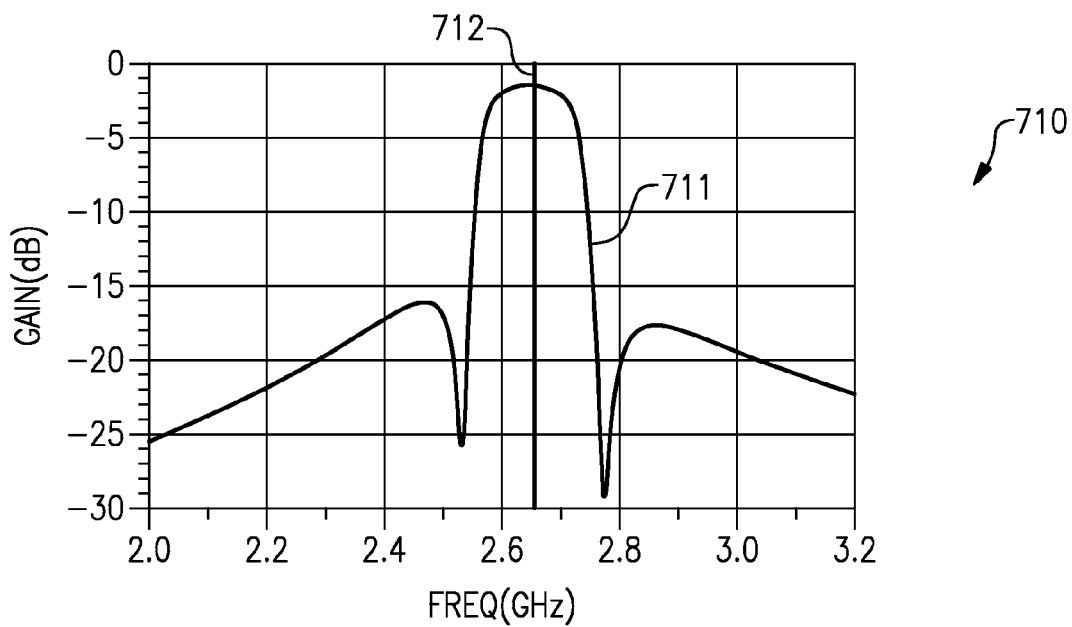
FIG. 17B is a graph of gain versus frequency for another embodiment of a tunable filter.

FIG. 17A is a first graph 700 of gain versus frequency for another embodiment of a tunable filter. FIG. 17B is a second graph 710 of gain versus frequency for another embodiment of a tunable filter.

The first graph 700 and the second graph 710 can represent gain versus frequency plots of one example of tunable filters for a programmable duplexer. The first graph 700 illustrates a first gain versus frequency plot 701 of a first tunable filter. The first plot 701 includes a first marker 702 at a frequency of about 2.655 GHz, where the gain is about −1.217 dB in this example. The second graph 710 illustrates a second gain versus frequency plot 711 of a second tunable filter. The second plot 711 includes a second marker 712 at a frequency of about 2.655 GHz, where the gain is about −1.498 dB in this example.

In certain LTE applications, more rejection and/or isolation can be desired on one end of the duplexer to provide higher TX/RX isolation. The tunable filters herein can be tuned asymmetrically by selectively tuning a resonator to provide more rejection on one side of the duplexer at the cost of an increase in insertion loss.

Capacitance and/or inductance values of a tunable filter can be selected in a variety of ways.

In one embodiment, a tunable filter includes an inductor and a capacitor electrically connected as a tunable resonator. Additionally, for a first inductance value $L_1$ and a first capacitance value $C_1$, the tunable filter has a first resonant frequency $F_1$ about equal to $$\frac{1}{2\pi\sqrt{L_1 * C_1}}.$$

Additionally, for a second inductance value $L_2$ and a second capacitance value $C_2$, the tunable filter has a second resonant frequency $F_2$ about equal to $$\frac{1}{2\pi\sqrt{L_2 * C_2}}.$$

Additionally, the square of the ratio of $F_2$ to $F_1$ can be given by Equation 3 below.

$$\left(\frac{F_2}{F_1}\right)^2 = \frac{C_1}{C_2} * \frac{L_1}{L_2} \qquad \text{Equation 3}$$

In one embodiment, $F_{MAX}$ corresponds to a highest resonance frequency (HRF) in a given band sequence, $F_{MIN}$ corresponds to a lowest resonance frequency (LRF) in a given band sequence, $C_{MAX}$ corresponds to a highest capacitance for LRF, and $C_{MIN}$ corresponds to a lowest capacitance for HRF. In certain configurations, a square of the ratio of $F_{MAX}$ to $F_{MIN}$ can be given by Equation 4 below.

$$\left(\frac{F_{MAX}}{F_{MIN}}\right)^2 = \frac{C_{MAX}}{C_{MIN}} * \frac{L_1}{L_2} \qquad \text{Equation 4}$$

In certain embodiments, Equation 4 can be used to select a tuning range of a variable capacitor used in a tunable filter.

For example, Equation 4 can be used to select $C_{MAX}$ and $C_{MIN}$ once $F_{MAX}$ and $F_{MIN}$ have been determined. Although one example of capacitance sizing has been described, a tunable resonators can have capacitance values selected or sized in other ways.

Figure 18:
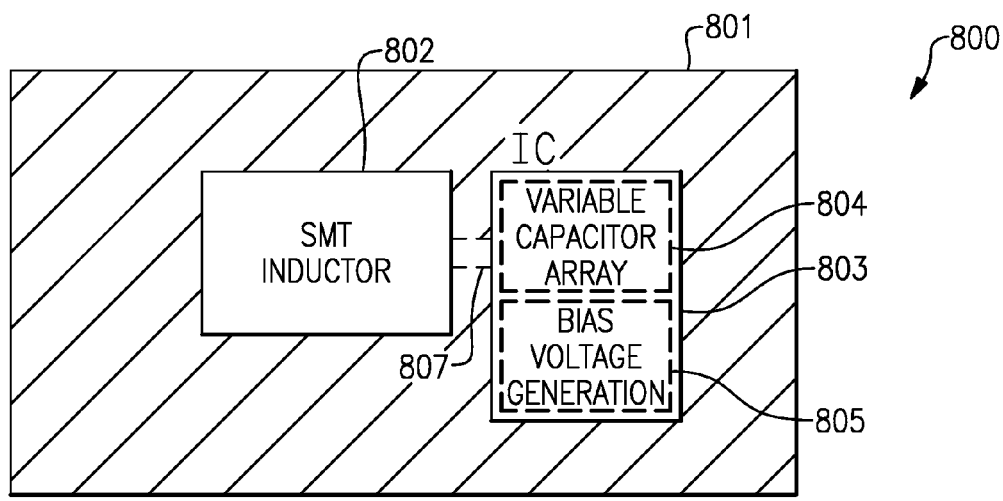
FIG. 18 is a schematic diagram of a tunable filter according to another embodiment.

FIG. 18 is a schematic diagram of a tunable filter 800 according to another embodiment. The tunable filter 800 includes a substrate 801, on which a surface mount technology (SMT) inductor or surface mount inductor 802 has been attached. Additionally, a semiconductor die or IC 803 has been placed on the substrate 801 adjacent to the SMT inductor 802. The illustrated tunable filter 800 illustrates a configuration in which a vector inductor has been omitted in favor of using an SMT inductor.

The IC 803 includes a variable capacitor array 804 and a bias voltage generation circuit 805, which can be implemented as described earlier with respect to FIGS. 12-15B. The SMT inductor 802 and the variable capacitor array 804 have been electrically connected using the conductor 807 to operate as a tunable resonator. Although FIG. 18 illustrates the SMT inductor 802 and the variable capacitor array 805 electrically connected as a series resonator, the teachings herein are also applicable to configurations in which an SMT inductor and variable capacitor array are electrically connected as a parallel resonator.

Additional details of the tunable filter 800 can be similar to those described earlier.

Figure 19:
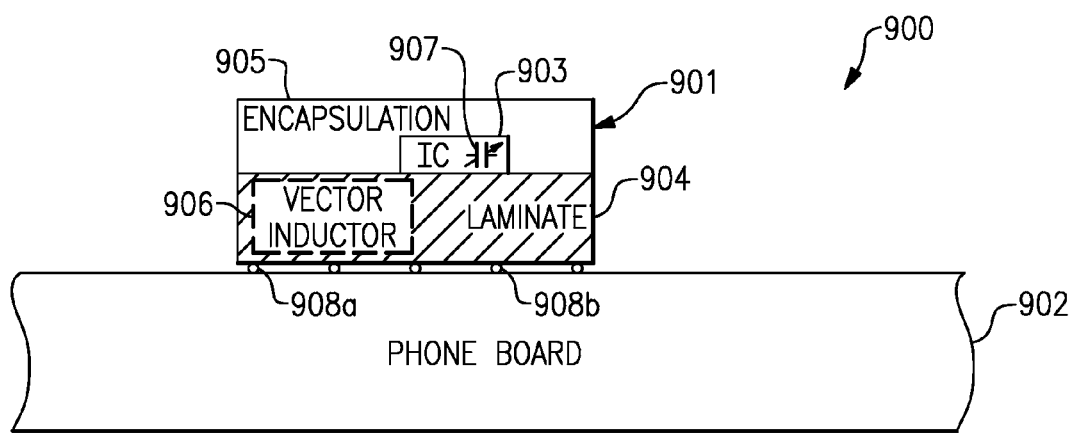
FIG. 19 is a schematic diagram of another embodiment of an RF system.

FIG. 19 is a schematic diagram of another embodiment of an RF system 900. The RF system 900 includes a multi-chip module (MCM) 901, which has been attached to a phone board 902. The MCM 901 includes a laminated substrate 904, which includes a vector inductor 906 formed therein. The MCM 901 further includes a semiconductor die or IC 907, which includes a variable capacitor 903 fabricated therein. The MCM 901 further includes encapsulation used to protect the IC 907.

As shown in the FIG. 19, a plurality of conductive balls have been used to provide electrical connections between the MCM 901 and the phone board 902. For example, a first conductive ball 908a can serve as a first RF input for the MCM 901, and a second conductive ball 908b can serve as a first RF output for the MCM 901.

In certain configurations herein, a tunable filter can be implemented as a MCM. Additionally, the MCM can include tunable resonators including vector inductors and/or variable capacitor arrays. For example, a vector inductor can be integrated into a laminated substrate of the MCM, and the vector inductor can be electrically connected with a variable capacitor array or other variable capacitor to operate as a series resonator or as a parallel resonator.

Additional details of the RF system 900 can be similar to those described earlier.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A tunable filter comprising:
a laminated substrate comprising a first vector inductor, wherein the first vector inductor includes no more than a single stack of non-spiral conductors including three or more conductors arranged on different layers of the laminated substrate, wherein each of the different conductive layers is separated by a dielectric, wherein the each of the three or more conductors are electrically connected to one another along a first side of the stack, and wherein each of the three or more conductors are electrically connected to one another along a second side of the stack opposite the first side, wherein the three or more conductors are electrically connected to one another along the first and second sides of the stack such that the three or more conductors are electrically connected in parallel with one another; and a semiconductor die attached to the laminated substrate, wherein the semiconductor die includes a first variable capacitor, wherein the first variable capacitor and the first vector inductor are electrically connected to operate as a first tunable resonator.

2. The tunable filter of claim 1, wherein adjacent conductors in the stack are mutually coupled to one another with a coupling coefficient of at least 0.9.

3. The tunable filter of claim 1, wherein each of the conductors in the stack have substantially the same shape and are adjacent to each other.

4. A tunable filter comprising:
a laminated substrate comprising a first vector inductor, wherein the first vector inductor includes: a stack of conductors comprising two or more conductors arranged on different conductive layers of the laminated substrate, wherein each of the different conductive layers is separated by a dielectric, wherein the two or more conductors are electrically connected to one another along a first side of the stack, and wherein the two or more conductors are electrically connected to one another along a second side of the stack opposite the first side; and
a semiconductor die attached to the laminated substrate, wherein the semiconductor die includes a first variable capacitor,
wherein the first variable capacitor and the first vector inductor are electrically connected to operate as a first tunable resonator,
wherein at least one of the first side or second side is tapered to compensate for differences in mutual coupling between the two or more conductors of the stack.

5. The tunable filter of claim 1, wherein the first variable capacitor comprises a first variable capacitor array and a bias voltage generation circuit configured to bias the first variable capacitor array to control a capacitance of the first variable capacitor array, wherein the first variable capacitor array comprises a first plurality of metal oxide semiconductor (MOS) variable capacitor cells.

6. The tunable filter of claim 5, wherein the first plurality of MOS variable capacitor cells comprises a first MOS variable capacitor cell comprising a first MOS capacitor and a second MOS capacitor, wherein the first MOS capacitor and the second MOS capacitor are electrically connected in anti-series.

7. The tunable filter of claim 5, wherein the first plurality of MOS variable capacitor cells comprises a first MOS variable capacitor cell comprising a first MOS capacitor and a second MOS capacitor, wherein the first MOS capacitor and the second MOS capacitor are electrically connected in anti-parallel.

8. The tunable filter of claim 1, wherein the first vector inductor comprises a first terminal on a first side of the laminated substrate and a second terminal on a second side of the laminated substrate opposite the first side of the laminated substrate, wherein the first terminal is electrically connected to the first side of the stack, wherein the second terminal is electrically connected to the second side of the stack.

9. The tunable filter of claim 1, wherein the first vector inductor and the first variable capacitor are electrically connected in series with one another.

10. The tunable filter of claim 9, wherein each of the conductors in the stack have a substantially rectangular shape when viewed from above the stack.

11. The tunable filter of claim 1, wherein the first vector inductor and the first variable capacitor are electrically connected in parallel with one another.

12. The tunable filter of claim 1, wherein the dielectric separating each of the different conductive layers has a thickness less than a thickness of each of the three or more conductors.

13. The tunable filter of claim 1,
wherein the semiconductor die further comprises a second variable capacitor,
wherein the laminated substrate further comprises a second vector inductor, wherein the second variable capacitor and the second vector inductor are electrically connected to operate as a second tunable resonator.

14. The tunable filter of claim 13,
wherein the laminated substrate further comprises a first ground isolation structure positioned between the first vector inductor and the second vector inductor.

15. The tunable filter of claim 13,
wherein the semiconductor die further comprises a third variable capacitor and a fourth variable capacitor,
wherein the laminated substrate further comprises a third vector inductor and a fourth vector inductor, wherein the third variable capacitor and the third vector inductor are electrically connected to operate as a third tunable resonator, wherein the fourth variable capacitor and the fourth vector inductor are electrically connected to operate as a fourth tunable resonator.

16. The tunable filter of claim 15,
wherein the first vector inductor and the first variable capacitor are electrically connected in series between a radio frequency input and an intermediate node,
wherein the second vector inductor and the second variable capacitor are electrically connected in series between a radio frequency output and the intermediate node,
wherein the third vector inductor and the third variable capacitor are electrically connected in series between a ground node and the intermediate node, and
wherein the fourth vector inductor and the fourth variable capacitor are electrically connected in series between the ground node and the intermediate node.

17. The tunable filter of claim 15,
wherein the first vector inductor and the first variable capacitor are electrically connected in parallel between a radio frequency input and an intermediate node,
wherein the second vector inductor and the second variable capacitor are electrically connected in parallel between a radio frequency output and the intermediate node,
wherein the third vector inductor and the third variable capacitor are electrically connected in parallel between a ground node and the intermediate node, and
wherein the fourth vector inductor and the fourth variable capacitor are electrically connected in parallel between the ground node and the intermediate node.

18. The tunable filter of claim 15,
wherein the laminated substrate further comprises a first ground isolation structure positioned between the first vector inductor and the fourth vector inductor, wherein the laminated substrate further comprises a second ground isolation structure between the second vector inductor and the fourth vector inductor, wherein the laminated substrate further comprises a third ground isolation structure between the second vector inductor and the third vector inductor, and wherein the laminated substrate further comprises a fourth ground isolation structure between the third vector inductor and the first vector inductor.

19. The tunable filter of claim 1, wherein the tunable filter comprises a multi-chip module, wherein the laminated substrate comprises a substrate of the multi-chip module.

20. The tunable filter of claim 1, wherein the first variable capacitor comprises a plurality of MOS variable capacitor cells electrically connected in parallel with one another, wherein the first variable capacitor further comprises a bias voltage generation circuit configured to bias the plurality of MOS variable capacitor cells based on a digital control signal to control a capacitance of the first variable capacitor, wherein the digital control signal digitally controls a frequency response characteristic of the first tunable resonator.

21. The tunable filter of claim 20, wherein the plurality of MOS variable capacitor cells comprises a first MOS variable capacitor cell comprising a first MOS capacitor and a second MOS capacitor, wherein the first MOS capacitor and the second MOS capacitor are electrically connected in anti-series or in anti-parallel.

22. The tunable filter of claim 1, wherein the laminated substrate further comprises a first plurality of vias that operate as a first plurality of conductive sidewalls to electrically connect the three or more conductors to one another along the first side of the stack, wherein the laminated substrate further comprises a second plurality of vias that operate as a second plurality of conductive sidewalls to electrically connect the three or more conductors to one another along the second side of the stack.

* * * * *